US00RE41369E

(19) United States
(12) Reissued Patent
Jobetto

(10) Patent Number: US RE41,369 E
(45) Date of Reissued Patent: Jun. 8, 2010

(54) SEMICONDUCTOR DEVICE AND METHOD OF MANUFACTURING THE SAME

(75) Inventor: Hiroyasu Jobetto, Hachioji (JP)

(73) Assignee: Casio Computer Co., Ltd., Tokyo (JP)

(21) Appl. No.: 11/788,397

(22) Filed: Apr. 19, 2007

Related U.S. Patent Documents

Reissue of:
(64) Patent No.: 6,882,054
Issued: Apr. 19, 2005
Appl. No.: 10/736,810
Filed: Dec. 15, 2003

(30) Foreign Application Priority Data

Dec. 24, 2002 (JP) ..... 2002-371538

(51) Int. Cl.
*H01L 23/48* (2006.01)

(52) U.S. Cl. ..... 257/759; 257/760; 257/E23.069; 257/E21.512; 257/E23.135; 438/623; 438/464; 438/465

(58) Field of Classification Search ..... 257/759, 257/760, E23.069, E21.512, E23.135; 438/623, 438/464, 465
See application file for complete search history.

(56) References Cited

U.S. PATENT DOCUMENTS

| | | | | | |
|---|---|---|---|---|---|
| 6,023,098 | A | * | 2/2000 | Higashiguchi et al. | 257/712 |
| 6,467,674 | B1 | * | 10/2002 | Mihara | |
| 6,486,005 | B1 | | 11/2002 | Kim | |
| 6,657,295 | B2 | * | 12/2003 | Araki | 257/712 |
| 6,749,927 | B2 | * | 6/2004 | Cooray | 428/209 |
| 6,909,054 | B2 | * | 6/2005 | Sakamoto et al. | 174/260 |
| 2002/0038890 | A1 | | 4/2002 | Ohuchi | |
| 2004/0014317 | A1 | * | 1/2004 | Sakamoto et al. | 438/689 |
| 2005/0051886 | A1 | | 3/2005 | Mihara et al. | |

FOREIGN PATENT DOCUMENTS

| | | | |
|---|---|---|---|
| JP | 11-233678 | A | 8/1999 |
| JP | 2001-326299 | A | 11/2001 |
| JP | 2001-332643 | A | 11/2001 |
| JP | 2002-016173 | A | 1/2002 |
| JP | 2002-84074 | A | 3/2002 |
| JP | 2002-231854 | A | 8/2002 |
| JP | 2002-246755 | A | 8/2002 |
| JP | 2002-246756 | A | 8/2002 |
| WO | WO 02/27786 | A1 | 4/2002 |

OTHER PUBLICATIONS

O et al., JP 2002–246756, Multilayer printed–wiring board and its manufacturing method, pubn–date: Aug. 30, 2002, machine translation.*

* cited by examiner

*Primary Examiner*—Tu-Tu V Ho
(74) *Attorney, Agent, or Firm*—Frishauf, Holtz, Goodman & Chick, P.C.

(57) ABSTRACT

A semiconductor device includes at least one semiconductor structure having a plurality of external connection portions on an upper surface, and an insulating member which is made of a resin containing reinforcing materials and arranged on a side of the semiconductor structure. An insulating film is formed on the upper surface of the semiconductor structure, except the external connection portions, and on an upper surface of the insulating member. A plurality of upper wirings each of which has a connection pad portion are located on an upper side of the insulating film and electrically connected to a corresponding one of the external connection portions of the semiconductor structure. The connection pad portion of at least one of the upper wirings is arranged above an upper surface of the insulating member.

27 Claims, 37 Drawing Sheets

SEMICONDUCTOR DEVICE AND METHOD OF MANUFACTURING THE SAME

Matter enclosed in heavy brackets [ ] appears in the original patent but forms no part of this reissue specification; matter printed in italics indicates the additions made by reissue.

CROSS-REFERENCE TO RELATED APPLICATIONS

This application is based upon and claims the benefit of priority from the prior Japanese Patent Application No. 2002-371538, filed Dec. 24, 2002, the entire contents of which are incorporated herein by reference.

BACKGROUND OF THE INVENTION

1. Field of the Invention

The present invention relates to a semiconductor device incorporating a chip-size semiconductor element and a method of manufacturing the same.

2. Description of the Related Art

In recent years, semiconductor devices called CSP (chip size package) have been developed as portable electronic devices represented by cellular phones decrease their sizes. In a CSP, a passivation film (intermediate insulating film) is formed on the upper surface of a bare semiconductor device having a plurality of connection pads for external connection. Opening portions are formed in the passivation film in correspondence with the connection pads. Wirings to be connected to the connection pads are formed through the opening portions. Columnar electrodes for external connection are formed on the other-terminal sides of the wirings. The space between the columnar electrodes for external connection is filled with a sealing material. According to this CSP, when solder balls are formed on the columnar electrodes for external connection, the device can be bonded to a circuit board with connection terminals by the face-down method. The mounting area can be almost the same as the size of the bare semiconductor device. The CSP can therefore greatly decrease the sizes of electronic devices as compared to the conventional face-up bonding method using wire bonding. A CSP capable of increasing the productivity is disclosed in, e.g., U.S. Pat. No. 6,467,674. In this prior art, a passivation film, wirings, external connection electrodes, and a sealing material are formed on a semiconductor substrate in a wafer state. After solder balls are formed on the upper surfaces of the external connection electrodes that are exposed without being covered with the sealing material, the wafer is cut along dicing lines.

The conventional semiconductor device raises the following problems when the number of external connection electrodes increases as the degree of integration becomes higher. As described above, a CSP normally has external connection electrodes arranged in a matrix on the upper surface of a bare semiconductor device. In a semiconductor device having many external connection electrodes, the size and pitch of the external connection electrodes become extremely small. Because of this disadvantage, the CSP technology cannot be applied to devices that have a large number of external connection electrodes relative to the size of the bare semiconductor device. If the external connection electrodes have extremely small size and pitch, alignment to the circuit board is difficult. There are also many fatal problems such as a low bonding strength, short circuit between electrodes in bonding, and destruction of external connection electrodes which is caused by stress generated due to the difference in coefficient of linear expansion between the circuit board and the semiconductor substrate normally formed from a silicon substrate.

BRIEF SUMMARY OF THE INVENTION

It is an object of the present invention to provide a new semiconductor device which can ensure necessary size and pitch of external connection electrodes even when the number of electrodes increases.

According to one aspect of the present invention there is provided a semiconductor device comprising: at least one semiconductor structure having a plurality of external connection portions on an upper surface; an insulating member which is made of a resin containing reinforcing materials and arranged on a side of the semiconductor structure; an insulating film which is formed on the upper surface of the semiconductor structure, except the external connection portions, and on an upper surface of the insulating member; and a plurality of upper wirings each of which has a connection pad portion which is located on an upper side of the insulating film and electrically connected to a corresponding one of the external connection portions of the semiconductor structure, the connection pad portion of at least one of the upper wirings being arranged above an upper surface of the insulating member.

DETAILED DESCRIPTION OF THE INVENTION (First Embodiment)

Figure 1:
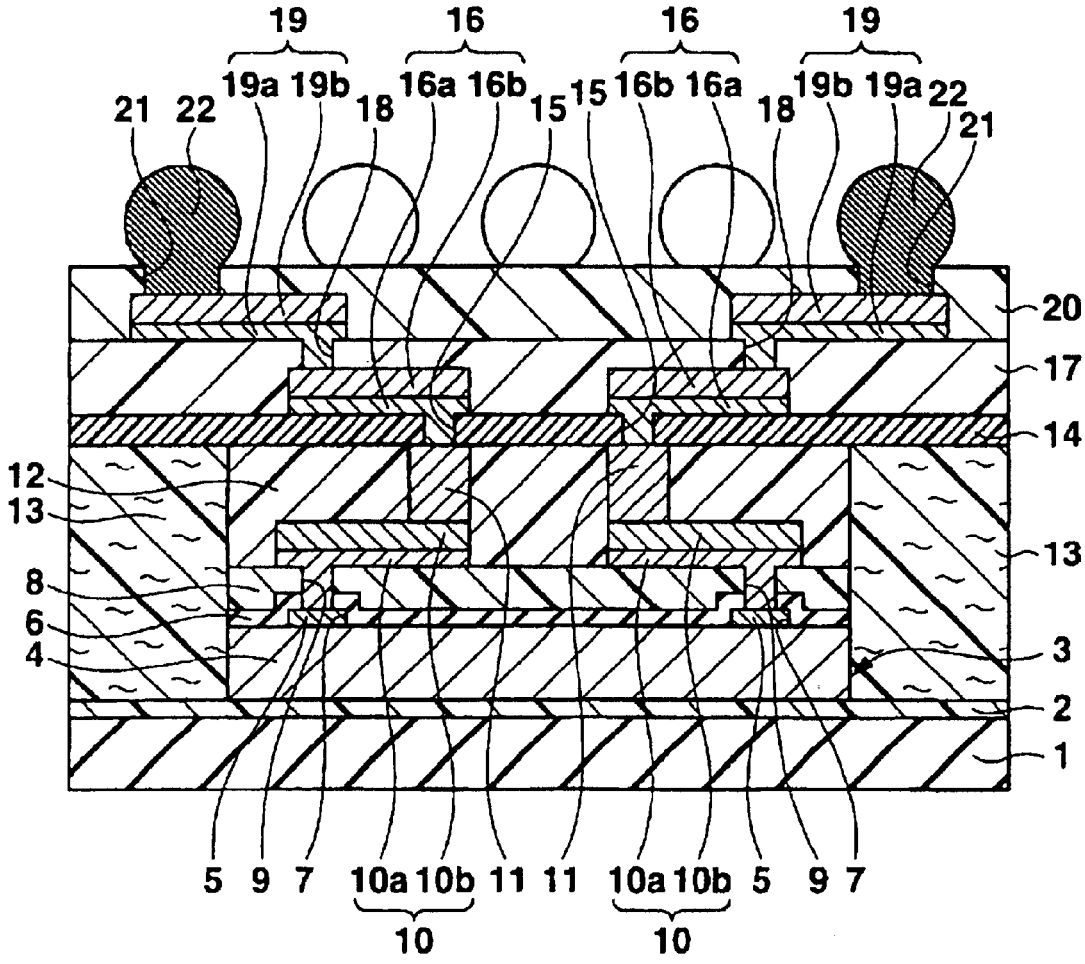
FIG. 1 is a sectional view of a finished semiconductor device according to the first embodiment of the present invention.

FIG. 1 is a sectional view of a semiconductor device according to the first embodiment of the present invention. This semiconductor device has a base plate 1 which has a rectangular planar shape and is made of silicon, glass, or ceramic. An adhesive layer 2 made of an adhesive agent, adhesive sheet, or double-coated tape is formed on the upper surface of the base plate 1.

A semiconductor structure 3 has a rectangular planar shape and is slightly smaller than the base plate 1. The lower surface of the semiconductor structure 3 is bonded to the central portion of the upper surface of the adhesive layer 2.

The semiconductor structure 3 is a device called a CSP. The semiconductor structure 3 has a silicon substrate (semiconductor substrate) 4 bonded to the central portion of the upper surface of the adhesive layer 2. An integrated circuit (not shown) is formed at the central portion of the upper surface of the silicon substrate 4. A plurality of connection pads 5 made of an aluminum-based metal are formed at the peripheral portion of the upper surface of the silicon substrate 4 and electrically connected to the integrated circuit or circuits. The upper surfaces of the connection pads, except the central portions, and the upper surface of the silicon substrate 4 are covered with an insulating film 6 made of silicon oxide. The central portion of each connection pad 5 is exposed through an opening portion 7 formed in the insulating film 6. The structure having the connection pads 5 and insulating film 6 formed on the silicon substrate 4 is normally obtained by dicing the silicon substrate 4 in a wafer state into individual chips or devices. In this embodiment, however, dicing is not yet performed when the connection pads 5 and insulating film 6 are formed on the silicon substrate 4 in the wafer state. As will be described below, only after the semiconductor structure 3 having wirings 10 and columnar electrodes 11 is obtained, the silicon substrate 4 in the wafer state is diced into individual semiconductor devices.

The structure of the semiconductor assembly 3 called a CSP will be described next in more detail. A protective film (insulating film) 8 made of epoxy resin or polyimide is formed on the upper surface of the insulating film 6 formed on the silicon substrate 4. The protective film 8 has opening portions 9 at positions corresponding to the opening portions 7 of the insulating film 6. The wiring 10, which has a lower or base metal layer 10a and an upper or cover metal layer 10b formed on it, extends from the upper surface of each connection pad 5 exposed through the opening portions 7 and 9 to a predetermined part of the upper surface of the protective film 8.

The columnar electrode 11 made of copper is formed on the upper surface of each wiring 10 at a position separated from the connection pad. A sealing film (insulating film) 12 made of epoxy resin or polyimide is formed on the upper surfaces of the wirings 10 and protective film 8, between the columnar electrodes 11. The upper surface of the sealing film 12 is flush with the upper surfaces of the columnar electrodes 11. As described above, the semiconductor structure 3 called a CSP includes the silicon substrate 4, connection pads 5, insulating film 6, protective film 8, wirings 10, columnar electrodes 11, and sealing film 12.

An insulating member 13 having a rectangular frame shape is formed on the upper surface of the adhesive layer 2 around the semiconductor structures 3. The insulating member 13 is made of a thermosetting resin such as epoxy resin or BT resin that contains a reinforcing material such as fibers or fillers made of an inorganic matter or matters. An example of the fiber is glass fiber or aramid fiber. An example of the filler is silica filler and ceramic filler. The insulating member 13 has almost the same thickness as that of the semiconductor structure 3.

The upper surfaces of the semiconductor structure 3 and insulating member 13 are covered with a first upper insulating film 14 made of epoxy resin or polyimide. The first upper insulating film 14 has an opening portion 15 at a position corresponding to the central portion of the upper surface of each columnar electrode 11. A first upper wiring 16, which has a first lower or base metal layer 16a and a first upper or cover metal layer 16b formed on it, extends from the upper surface of each columnar electrode 11 exposed through the opening portion 15 to a predetermined part of the upper surface of the first upper insulating film 14. The first upper wiring 16 on the upper insulating film 14 extends outward from the opening portion 15.

A second upper insulating film 17 made of epoxy resin or polyimide is formed on the upper surfaces of the first upper wirings 16 and first upper insulating film 14. The second upper insulating film 17 has an opening portion 18 at a position corresponding to the connection pad portion (extended end portion) of each first upper wiring 16. A second upper wiring 19 which has a second lower or base metal layer 19a and a second upper or cover metal layer 19b formed on it, extends from the upper surface of the connection pad portion of each first upper wiring 16 exposed through the opening portion 18 to a predetermined part of the upper surface of the second upper insulating film 17. The second upper wiring 19 on the second upper insulating film 17 extends outward from the opening portion 18.

A third upper insulating film 20 made of epoxy resin or polyimide is formed on the upper surfaces of the second upper wirings 19 and second upper insulating film 17. The third upper insulating film 20 has an opening portion 21 at a position corresponding to the connection pad portion (extended end portion) of each second upper wiring 19. The connection pad portions of the second upper wirings 19 are arranged in a matrix. Solder balls 22 are electrically connected to the connection pad portions of the second upper wirings 19 through the opening portions 21. The solder balls 22 extend upward from the third upper insulating film 20 at the opening portions 21. The solder balls 22 are arranged in a matrix on the third upper insulating film 20.

As described above, the planar size of the base plate 1 is slightly larger than that of the semiconductor structure 3. This is because the arrangement region of the solder balls 22 should become slightly larger than the planar size of the semiconductor structure 3 as the number of connection pads 5 on the silicon substrate 4 increases. Accordingly, the size and pitch of the connection pad portions (the portions in the opening portions 21 of the third upper insulating film 20) of the second upper wirings 19 become larger than those of the columnar electrodes 11.

Hence, the connection pad portions of the second upper wirings 19 arranged in a matrix are arranged not only on the region corresponding to the semiconductor structure 3 but also on the region corresponding to the insulating member 13 formed outside the side surfaces of the semiconductor structure 3. That is, of the solder balls 22 arranged in a matrix, at least the solder balls 22 at the outermost positions are arranged around the semiconductor structure 3.

In this case, all the connection pad portions of the second upper wirings 19 may be arranged around the semiconductor structure 3. Alternatively, only the first upper wirings 16 may be formed without forming the second upper wirings. The connection pad portions of at least upper wirings 16 at the outermost positions may be located around the semiconductor structure 3, and the solder balls 22 may be directly connected to the connection pad portions of the upper wirings 16.

As described above, as a characteristic feature of this semiconductor device, the semiconductor structure 3 is constructed by forming not only the connection pads 5 and insulating film 6 but also the protective film 8, wirings 10, columnar electrodes 11, and sealing film 12 on the silicon substrate 4, and the insulating member 13 is formed around the semiconductor structure 3. At least the first upper insulating film 14 and the first upper wirings 16 connected to the columnar electrodes 11 through the opening portions 15 formed in the first upper insulating film 14 are arranged on the upper surface of the semiconductor structure 3.

In this case, the insulating member 13 having a rectangular frame shape and arranged around the semiconductor structures 3 is made of a thermosetting resin containing a reinforcing material such as a fiber or filler. As compared to a structure made of only a thermosetting resin, stress due to shrinkage in setting the thermosetting resin can be reduced. This also prevents the base plate 1 from warping. Furthermore, the insulating member 13 is capable of flattening itself and planarization with respect to the semiconductor structure 3. For this reason, the height positions of the upper surfaces of the upper wirings 16 and 19 and solder balls 22, which are formed in subsequent steps, can be uniformed, and the reliability of bonding can be increased.

(Manufacturing Method)

Figure 2:
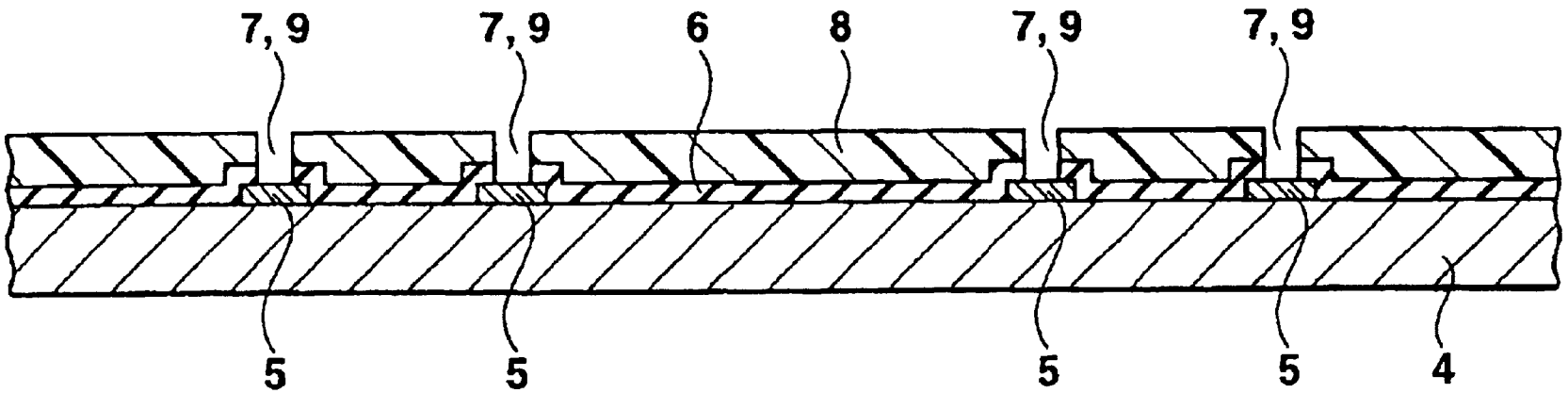
FIG. 2 is a sectional view of an initially prepared pre-device in an example of a method of manufacturing the semiconductor device shown in FIG. 1.

An example of a method of manufacturing the semiconductor device will be described next. First, an example of a method of manufacturing the semiconductor structure 3 will be described. As shown in FIG. 2, the connection pads 5 made of an aluminum-based metal and the insulating film 6 made of silicon oxide are formed on the silicon substrate (semiconductor substrate) 4 in a wafer state. The protective film 8 made of epoxy resin or polyimide is formed on the resultant structure. A semiconductor structure pre-device (an incomplete semiconductor structure that is still under manufacture) is thus prepared in which the central portion of each connection pad 5 is exposed through the opening portions 7 and 9 formed in the insulating film 6 and protective film 8.

Figure 3:
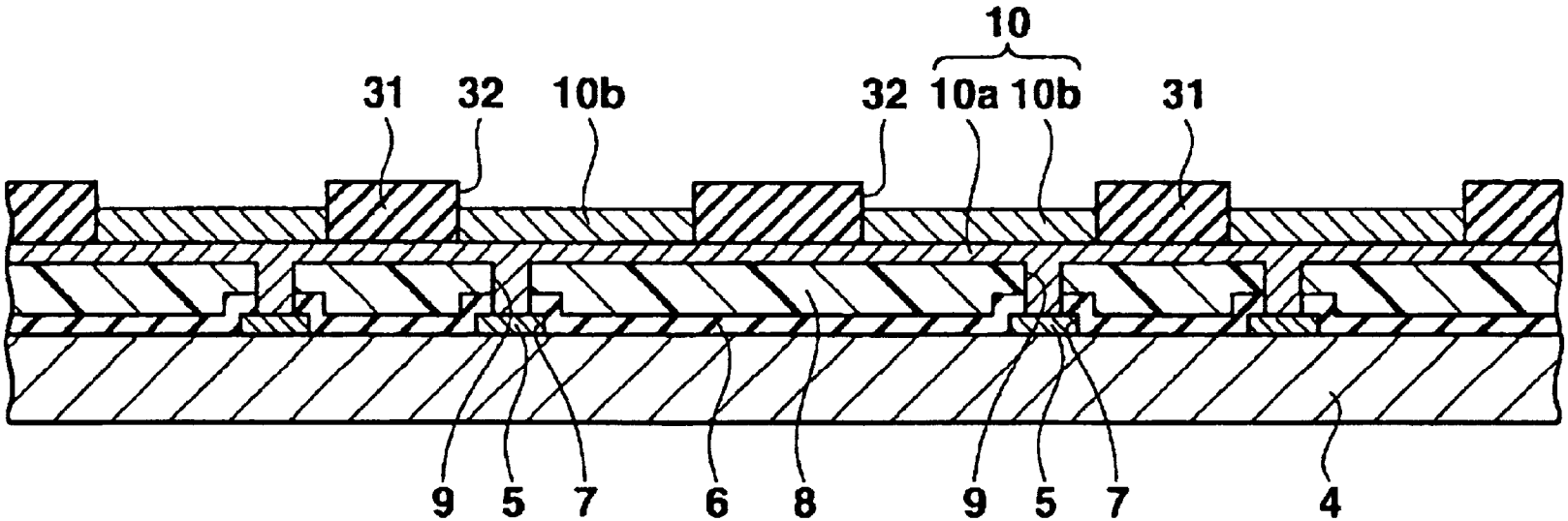
FIG. 3 is a sectional view of the pre-device in a manufacturing step following FIG. 2.

As shown in FIG. 3, the lower metal layer 10a (properly speaking, one metal layer before formation of a plurality of lower metal layers which however have the same name and same reference numeral for the descriptive convenience, and this description method is also applied to other members to be described later) is formed on the entire upper surface of the protective film 8, including the upper surfaces of the connection pads 5 exposed through the opening portions 7 and 9. In this case, the lower metal layer 10a may have only a copper layer formed by electroless plating or only a copper layer formed by sputtering. Alternatively, a copper layer may be formed by sputtering on a thin titanium layer formed by sputtering. This also applies to the lower metal layers 16a and 19a of the upper wirings.

Next, a plating resist film 31 is patterned on the upper surface of the lower metal layer 10a. In this case, the plating resist film 31 has an opening portion 32 at a position corresponding to the formation region of each wiring 10. Copper electroplating is executed using the lower metal layer 10a as a plating current path to form the upper metal layer 10b on the upper surface of the lower metal layer 10a in each opening portion 32 on the plating resist film 31. Then, the plating resist film 31 is removed.

Figure 4:
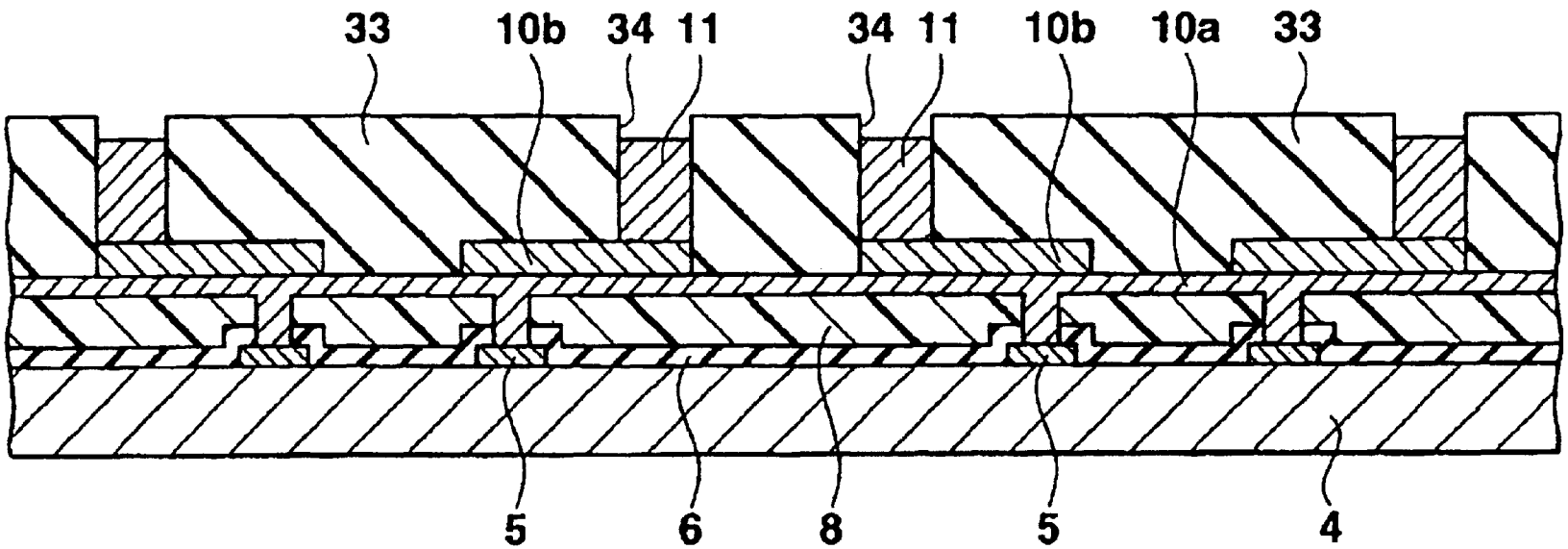
FIG. 4 is a sectional view of the pre-device in a manufacturing step following FIG. 3.

As shown in FIG. 4, a plating resist film 33 is formed and then patterned on the upper surfaces of the upper metal layer 10b and lower metal layer 10a. In this case, the plating resist film 33 has an opening portion 34 at a position corresponding to the formation region of each columnar electrode 11. Copper electroplating is executed using the lower metal layer 10a as a plating current path to form the columnar electrode 11 on the upper surface of the connection pad portion of the upper metal layer 10b in each opening portion 34 of the plating resist film 33.

Figure 5:
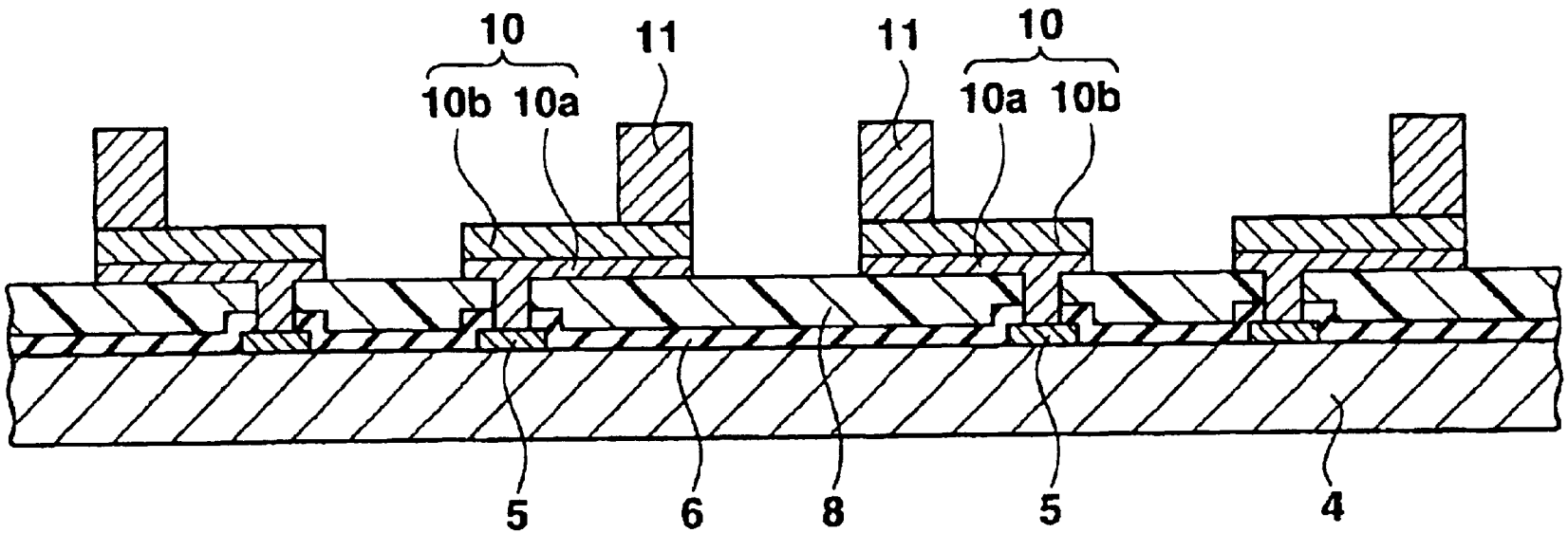
FIG. 5 is a sectional view of the pre-device in a manufacturing step following FIG. 4.

The plating resist film 33 is removed. Then, unnecessary portions of the lower metal layer 10a are removed by etching using the columnar electrodes 11 and upper metal layers 10b as a mask so that the lower metal layers 10a are left only under the upper metal layers 10b, as shown in FIG. 5. Each left lower metal layer 10a and the upper metal layer 10b formed on the entire upper surface of the lower metal layer 10a construct the wiring 10.

Figure 6:
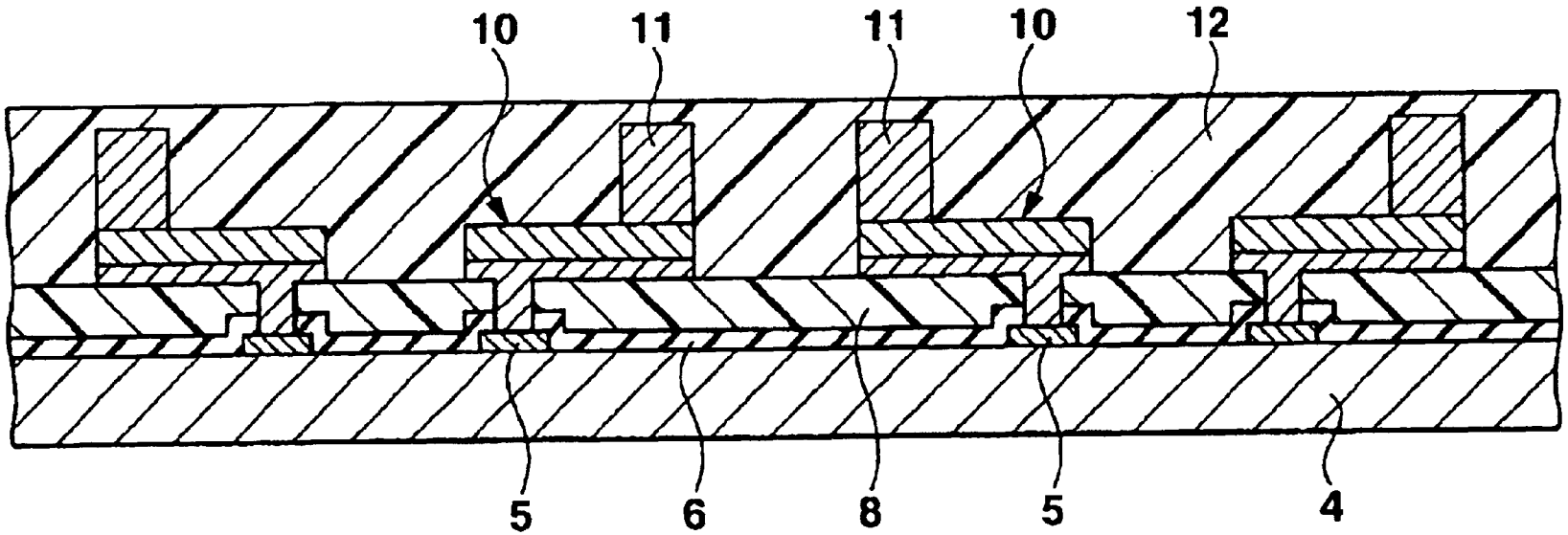
FIG. 6 is a sectional view of the pre-device in a manufacturing step following FIG. 5.

As shown in FIG. 6, the sealing film 12 made of epoxy resin or polyimide is formed on the entire upper surfaces of the columnar electrodes 11, wirings 10, and protective film 8 by screen printing or spin coating. The sealing film 12 has a thickness more than the height of the columnar electrodes 11. Hence, in this state, the upper surfaces of the columnar electrodes 11 are covered with the sealing film 12.

Figure 7:
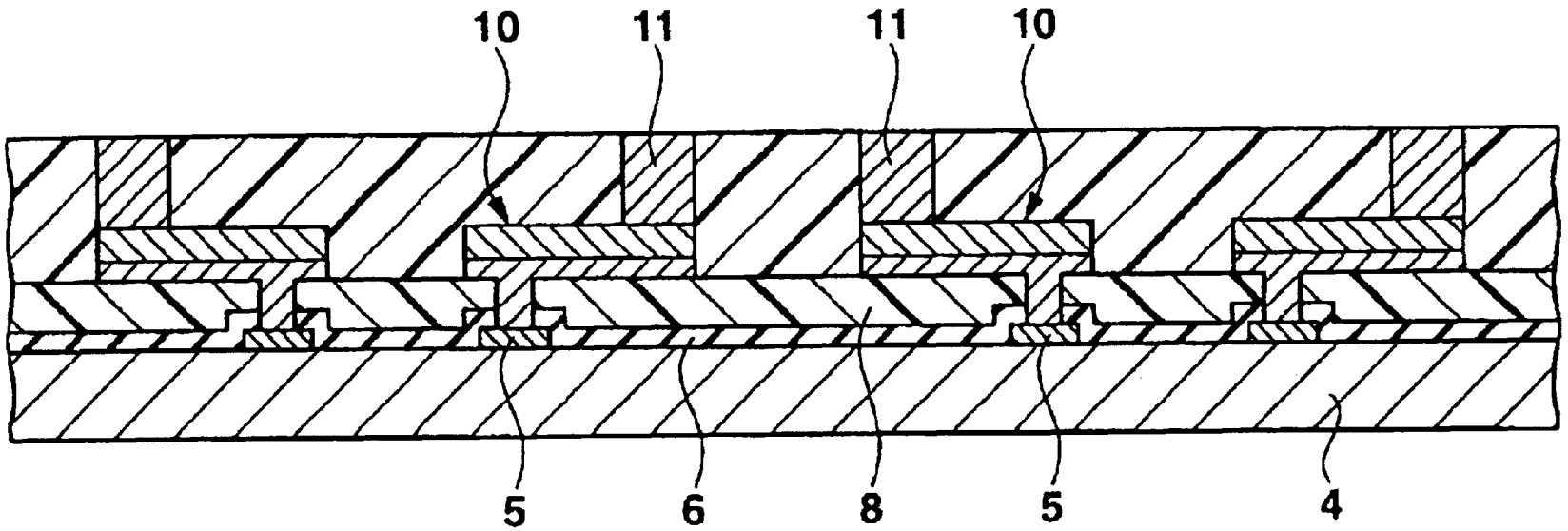
FIG. 7 is a sectional view of the pre-device in a manufacturing step following FIG. 6.
Figure 8:
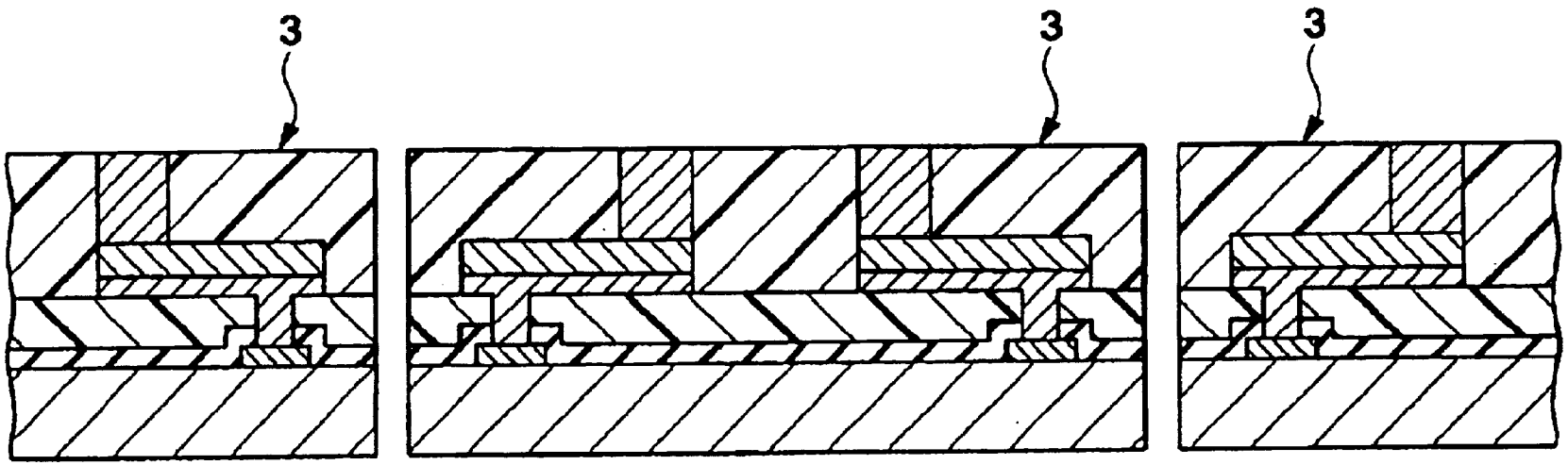
FIG. 8 is a sectional view of the pre-device in a manufacturing step following FIG. 7.

The upper surface side of the sealing film 12 and columnar electrodes 11 is appropriately polished to expose the upper surfaces of the columnar electrodes 11, as shown in FIG. 7. The exposed upper surfaces of the columnar electrodes 11 and the upper surface of the sealing film 12 are planarized. As shown in FIG. 8, finally the resultant structure is separated into individual semiconductor structures by the dicing step, thereby obtaining a plurality of semiconductor structures 3 shown in FIG. 1.

As described above, the reason why the upper surface side of the columnar electrodes 11 is appropriately polished is that the heights of the columnar electrodes 11 formed by electroplating are uniformed by canceling a variation therebetween. To simultaneously polish the columnar electrodes 11 made of soft copper and the sealing film 12 made of epoxy resin or the like, the polishing is executed by using a grinder having a grindstone with an appropriate roughness.

Figure 9:
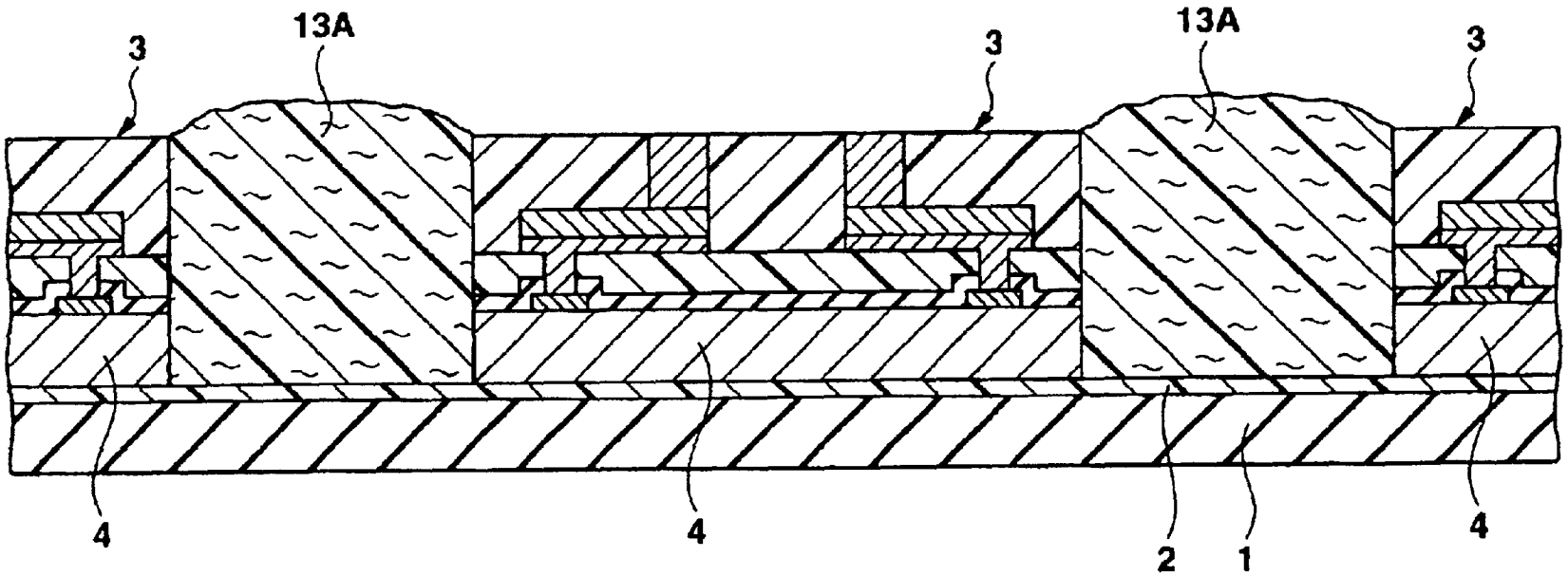
FIG. 9 is a sectional view of the pre-device in a manufacturing step following FIG. 8.

An example will be described next, in which the semiconductor device shown in FIG. 1 is manufactured by using the semiconductor structure 3 obtained in the above-described way. As shown in FIG. 9, the adhesive layer 2 is formed on the entire upper surface of the base plate 1. The plate is so large that a plurality of base plates 1 shown in FIG. 1 can be sampled therefrom. The base plate 1 has a rectangular planar shape and, more preferably, an almost square planar shape, though the shape is not limited. The lower surfaces of the silicon substrates 4 of the semiconductor structures 3 are bonded to a plurality of predetermined portions of the upper surface of the adhesive layer 2 preferably in a matrix while being separated from each other at a predetermined interval.

An insulating material 13A made of a thermosetting resin such as epoxy resin or BT resin that contains a reinforcing materials such as fibers or fillers is placed on the upper surface of the adhesive layer 2 between the semiconductor structures 3 and outside those arranged at the outermost positions so as to be formed slightly higher than the upper surfaces of the semiconductor structures 3 in a semi-set state.

Figure 10:
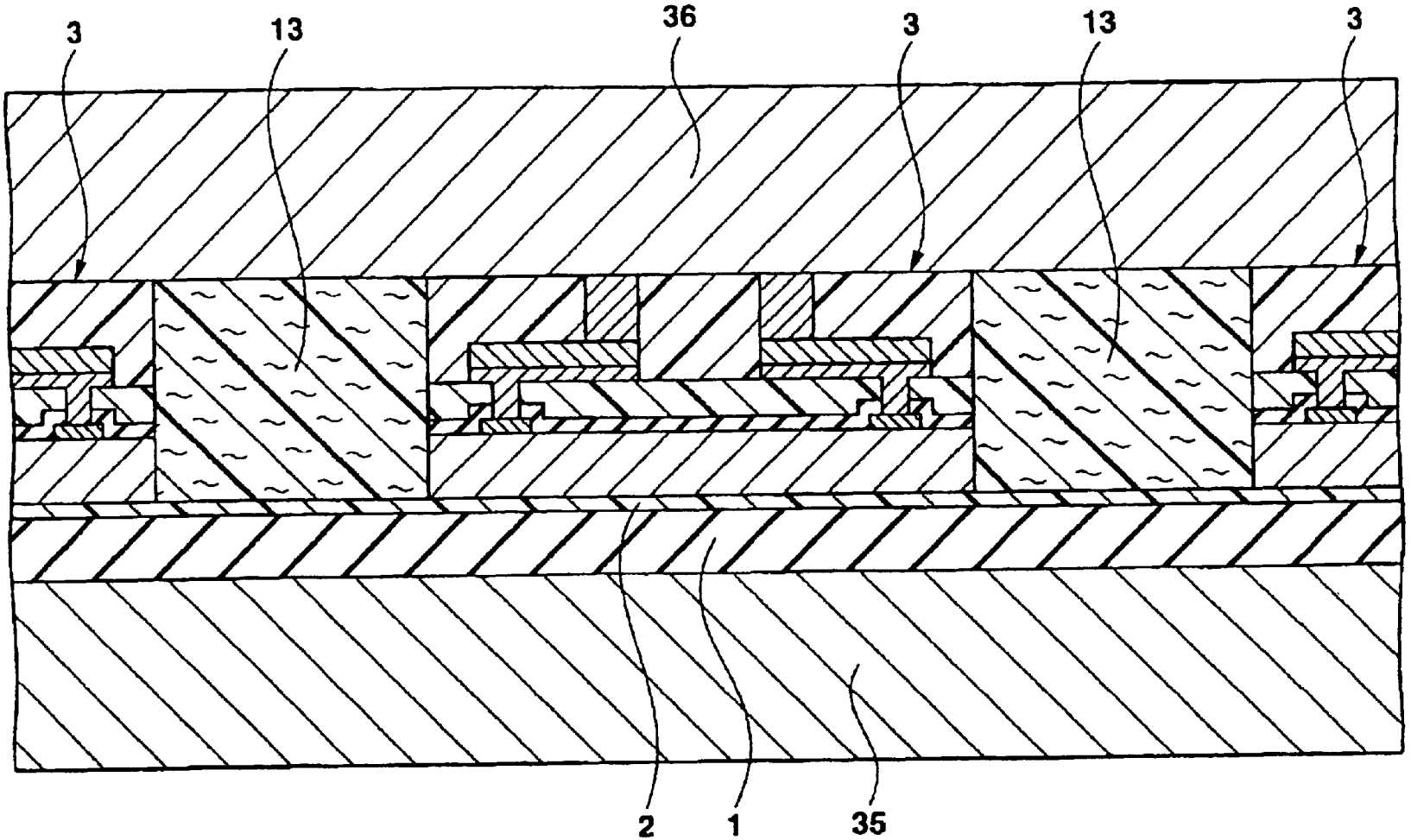
FIG. 10 is a sectional view of the pre-device in a manufacturing step following FIG. 9.

As shown in FIG. 10, the insulating material 13A is heated and pressed by using a pair of heating/pressing plates 35 and 36. Accordingly, the insulating member 13 is formed on the upper surface of the adhesive layer 2 between the semiconductor structures 3 and outside those arranged at the outer-most positions to be almost flush with the upper surfaces of the semiconductor structures 3. In this case, heating and pressing are executed while causing the lower heating/pressing plate 35 to abut against the lower surface of the base plate 1 and the upper heating/pressing plate 36 to abut against the upper surfaces of the semiconductor structures 3 and insulating material 13A.

As shown in FIG. 7, in the wafer state, the columnar electrodes 11 in each semiconductor structure 3 have a uniform height. In addition, the upper surface of the sealing film 12, including the upper surfaces of the columnar electrodes 11, is planarized. For this reason, in the state shown in FIG. 10, the plurality of semiconductor structures 3 have the same thickness or height.

In the state shown in FIG. 10, when heating and pressing are performed while defining the upper surface of the semiconductor structure 3 as a press limit surface, the insulating member 13 obtains almost the same thickness as that of the semiconductor structure 3. When an open-ended flat press is used as a press having the pair of heating/pressing plates 35 and 36, the excess thermosetting resin in the insulating material 13A is squeezed out of the pair of heating/pressing plates 35 and 36. When the thermosetting resin in the insulating member 13 is set completely in this state, the upper surface of the opening portion 15 becomes almost flush with the upper surfaces of the semiconductor structures 3. In the manufacturing step shown in FIG. 10, heating/pressing may be executed by separate means. That is, for example, pressing is executed only from the upper surface while the lower surface side of the semiconductor structures 3 is heated by a heater through the base plate 1. Alternatively, heating and pressing may be executed in separate steps.

In this way, since the thickness or height of the insulating member 13 is made almost equal to that of the semiconductor structure 3 by heating and pressing or only pressing, the polishing step can be omitted. Hence, even when the planar size of the base plate 1 is relatively as large as, e.g., about 500×500 mm, the insulating member 13 can easily be planarized at once with respect to the plurality of semiconductor structures 3 arranged on the base plate 1.

In the heating/pressing step, even when the excess thermosetting resin in the insulating material 13A overflows onto the semiconductor structures 3, the thermosetting resin layer formed by the overflow need not always be removed if it has a negligible thickness. On the other hand, if the thickness of the thermosetting resin layer formed by the overflow cannot be neglected, the layer is removed by buffing.

As another example of polishing, an inexpensive and inaccurate endless polishing belt is partially flattened. While defining the upper surfaces of the semiconductor structures 3 as a press limit surface, the upper surfaces of the semiconductor structures 3 and the thermosetting resin layer that covers the upper surface of the insulating member 13 with a desired thickness may be smoothened and polished by using the flattened portion.

A polishing apparatus using a buff or endless polishing belt can easily cope with a relatively large base plate 1 having a size of, e.g., about 500×500 mm. In addition, since only one cycle of polishing step suffices, polishing can easily be executed in a short time. This polishing step is preferably executed without causing sagging on the upper surface side of the columnar electrodes 11 from the viewpoint of productivity, unlike polishing using a grindstone or the like.

The insulating member 13 having a rectangular frame shape and arranged around the semiconductor structure 3 is made of a thermosetting resin containing reinforcing materials such as fibers or fillers. For this reason, as compared to a structure made of only a thermosetting resin, stress due to shrinkage in setting the thermosetting resin can be reduced. This also prevents the base plate 1 from warping. A sheet-shaped member in which opening portions each having a planar size almost equal to or slightly larger than that of the semiconductor structure 3 are formed in advance at positions corresponding to the semiconductor structures 3 may be used as the insulating member 13. In the above embodiment, after the plurality of semiconductor structures 3 are arranged on the base plate 1, the insulating material 13A is arranged. Instead, the semiconductor structures 3 may be arranged after the insulating material 13A having opening portions formed in correspondence with the semiconductor structures 3 is arranged on the base plate 1.

Figure 11:
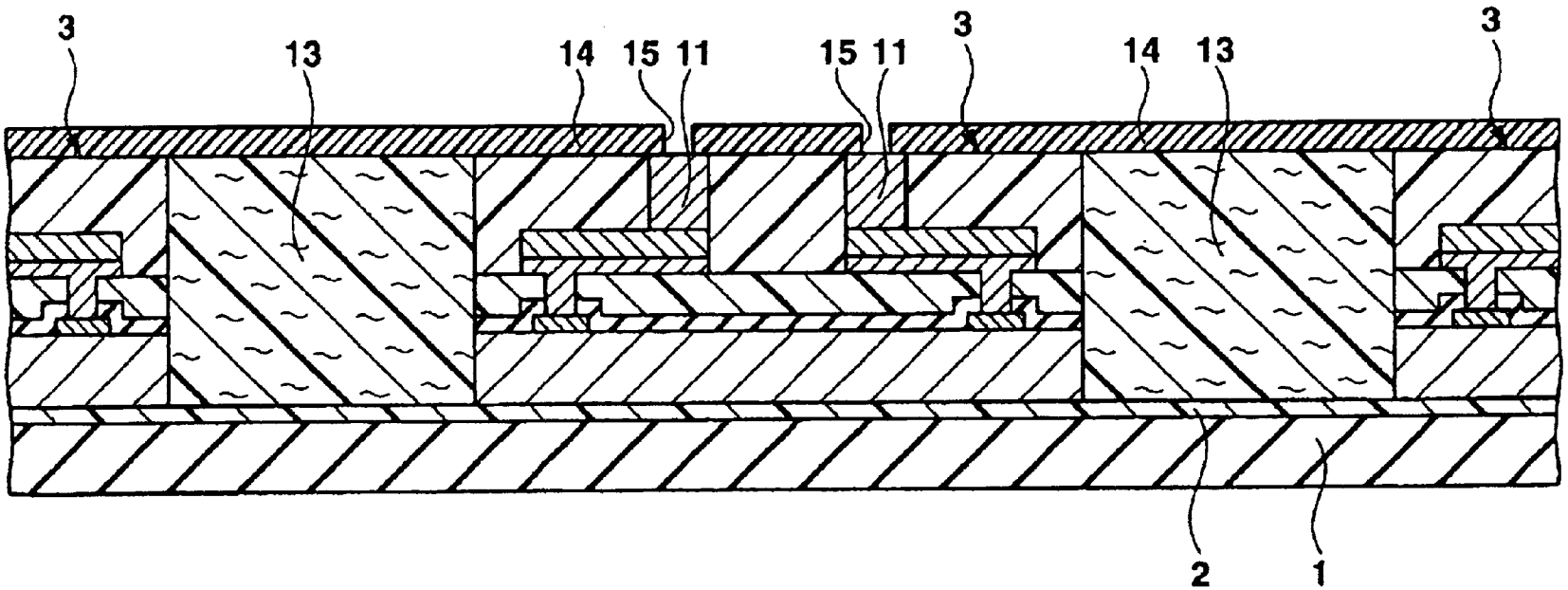
FIG. 11 is a sectional view of the pre-device in a manufacturing step following FIG. 10.

After the step shown in FIG. 10, the first upper insulating film 14 is formed on the entire upper surfaces of the semiconductor structures 3 and insulating member 13, which are almost flush with each other, as shown in FIG. 11. The first upper insulating film 14 can be formed either by laminating a resin sheet or by applying a liquid resin. When the first upper insulating film 14 is formed using a photosensitive resin such as epoxy resin or Cardo-type resin, the opening portions 15 are formed by photolithography in the first upper insulating film 14 at positions corresponding to the central portions of the upper surfaces of the columnar electrodes 11.

When the first upper insulating film 14 is formed using a non-photosensitive resin such as epoxy resin or BT resin, the opening portions 15 are formed in the first upper insulating film 14 by laser machining for irradiating the film with a laser beam. In this case, even if the thermosetting resin layer formed onto a surface of the semiconductor structure; when the thermosetting resin in the insulating material 13A overflows thereto in the manufacturing step shown in FIG. 10 has a thickness that cannot be neglected, the above-described polishing step may be omitted as long as the layer is so thin that opening portions can be formed by laser machining.

Figure 12:
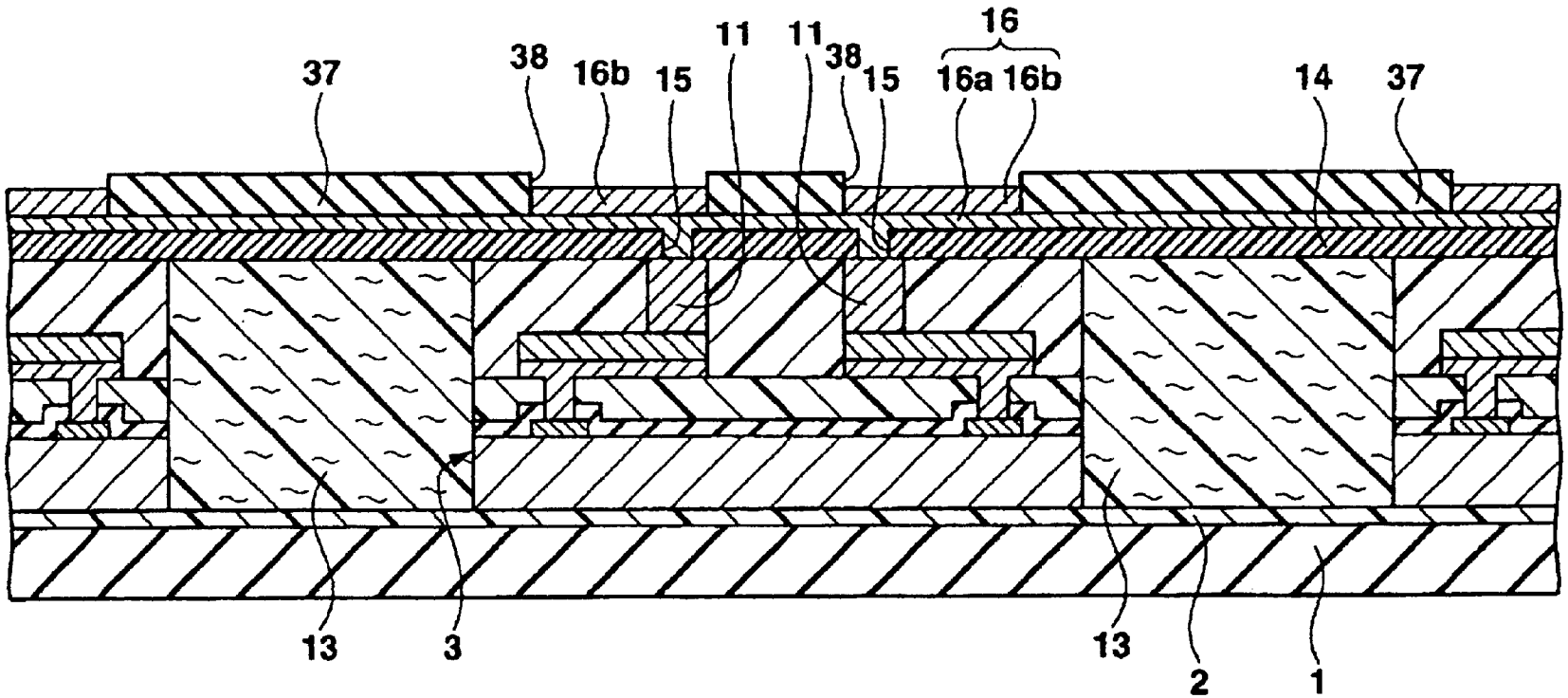
FIG. 12 is a sectional view of the pre-device in a manufacturing step following FIG. 11.

As shown in FIG. 12, the first lower metal layer 16a is formed on the entire upper surface of the first upper insulating film 14, including the upper surfaces of the columnar electrodes 11 exposed through the opening portions 15. A plating resist film 37 is formed and patterned on the upper surface of the first lower metal layer 16a. In this case, the plating resist film 37 has an opening portion 38 at a position corresponding to the formation region of each first upper wiring 16. Copper electroplating is executed using the first lower metal layer 16a as a plating current path to form the first upper metal layer 16b on the upper surface of the first lower metal layer 16a in each opening portion 38 of the plating resist film 37.

Figure 13:
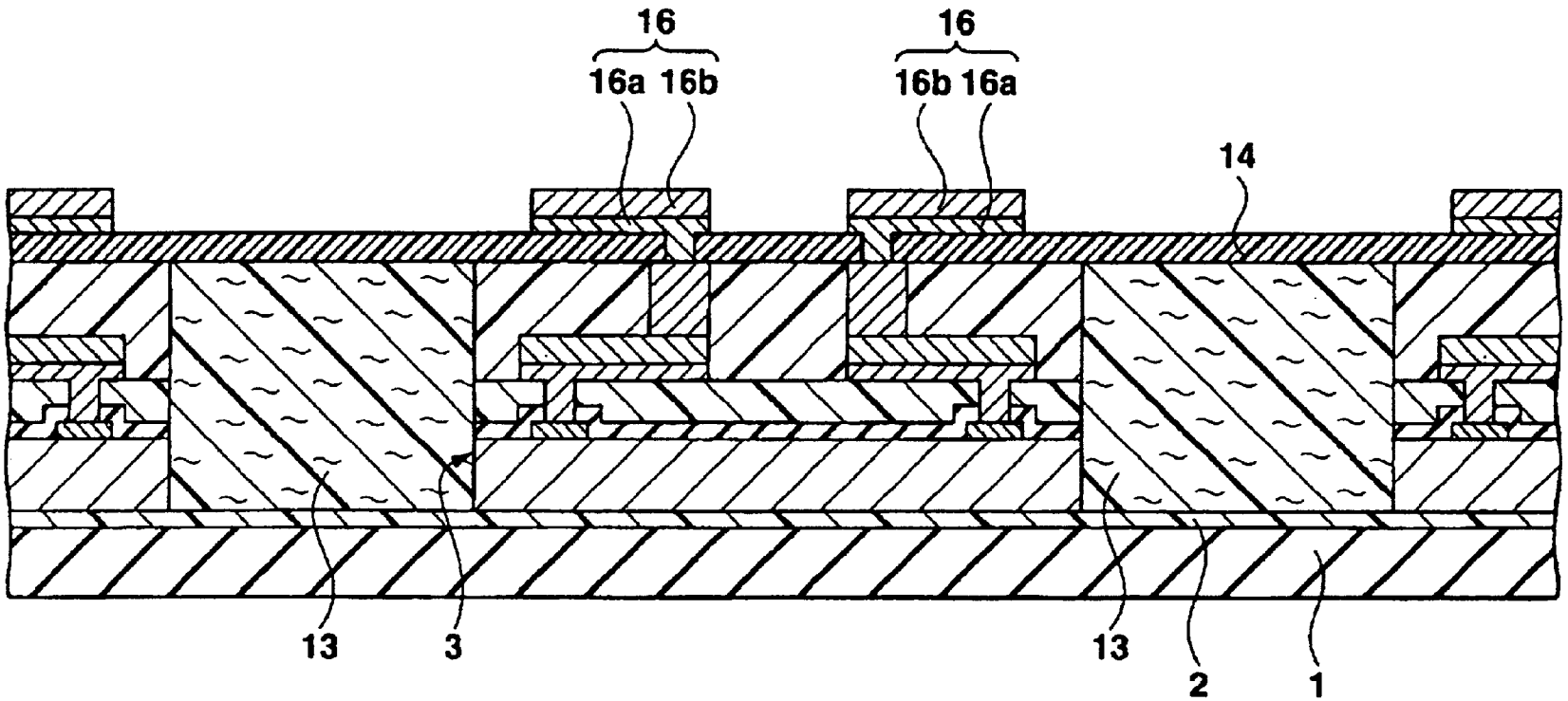
FIG. 13 is a sectional view of the pre-device in a manufacturing step following FIG. 12.

The plating resist film 37 is removed. Then, unnecessary portions of the first lower metal layer 16a are removed by etching using the first upper metal layers 16b as a mask so that the first lower metal layers 16a are left only under the first upper metal layers 16b, as shown in FIG. 13. Each left first lower metal layer 16a and the first upper metal layer 16b formed on the entire upper surface of the first lower metal layer 16a construct the first upper wiring 16.

Figure 14:
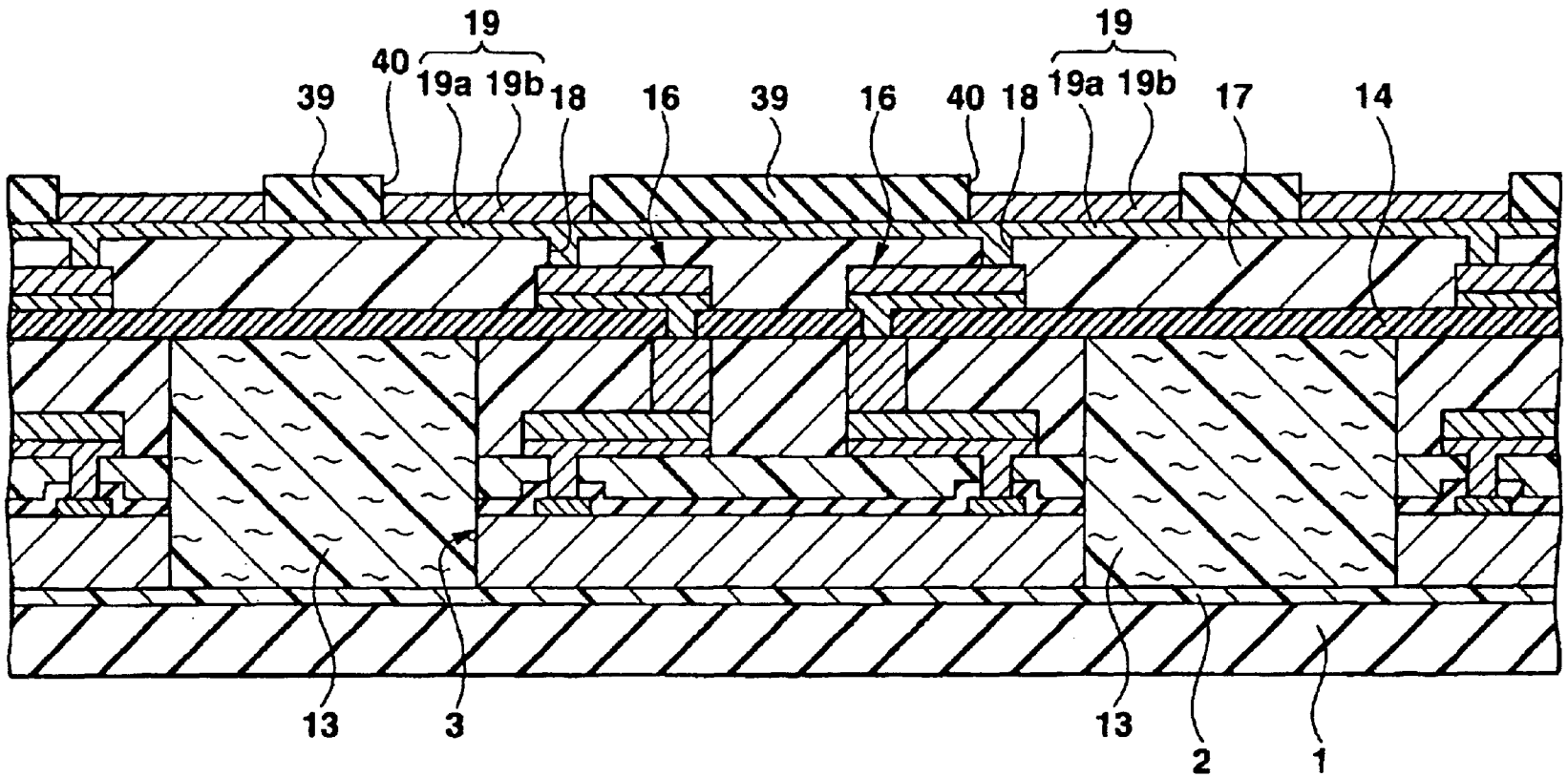
FIG. 14 is a sectional view of the pre-device in a manufacturing step following FIG. 13.

As shown in FIG. 14, the second upper insulating film 17 made of epoxy resin or polyimide is formed on the upper surfaces of the first upper wirings 16 and first upper insulating film 14 by screen printing or spin coating. In this case, the second upper insulating film 17 has the opening portions 18 at positions corresponding to the connection pad portions of the first upper wirings 16. The second lower metal layer 19a is formed on the entire upper surface of the second upper insulating film 17 including the connection pad portions of the first upper wirings 16 exposed through the opening portions 18.

A plating resist film 39 is patterned on the upper surface of the second lower metal layer 19a. The plating resist film 39 has an opening portion 40 at a position corresponding to the formation region of each second upper wiring 19. Copper electroplating is executed using the second lower metal layer 19a as a plating current path to form the second upper metal layer 19b on the upper surface of the second lower metal layer 19a in each opening portion 40 of the plating resist film 39.

Figure 15:
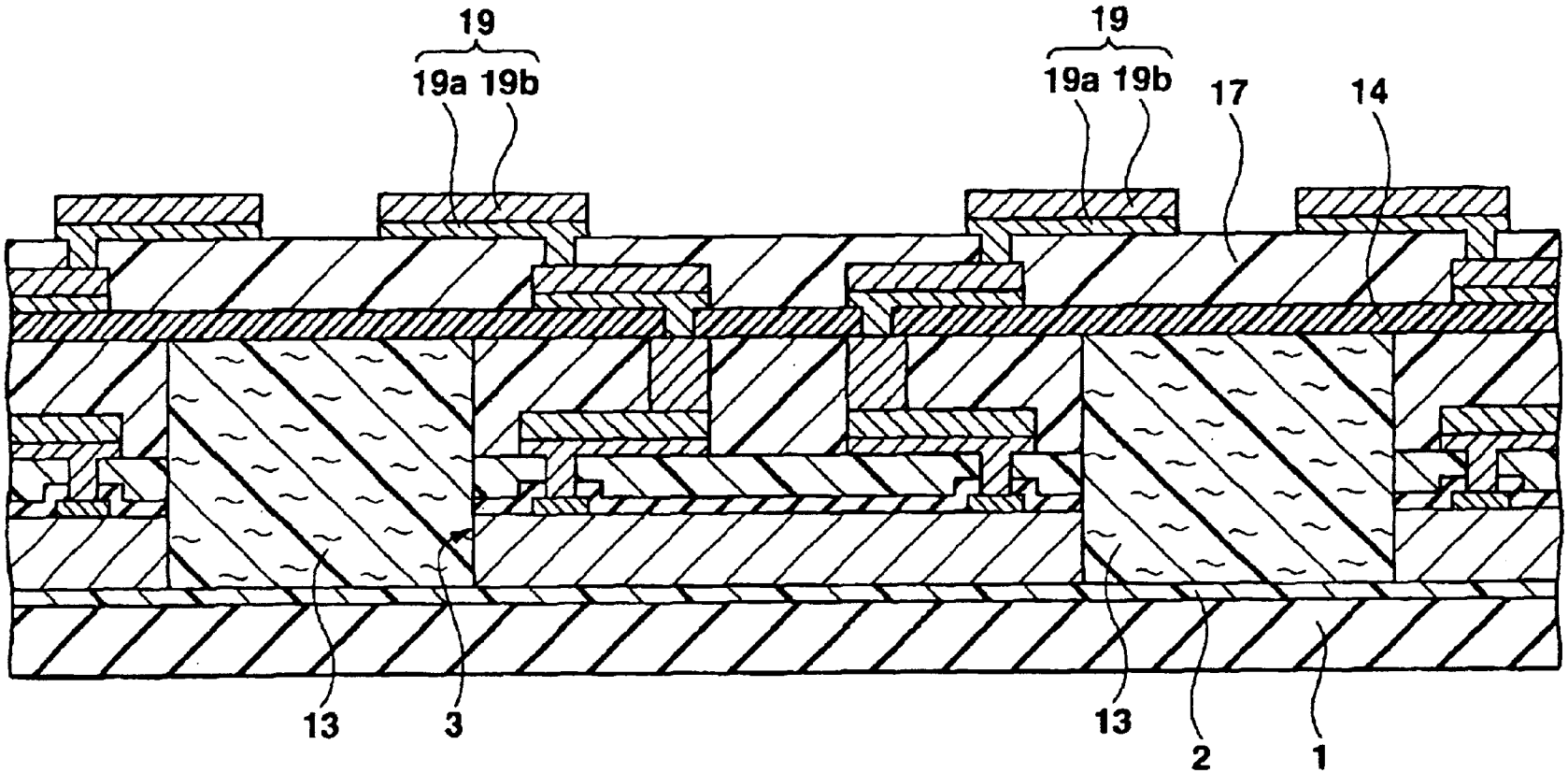
FIG. 15 is a sectional view of the pre-device in a manufacturing step following FIG. 14.

The plating resist film 39 is removed. Then, unnecessary portions of the second lower metal layers 19a are removed by etching using the second upper metal layers 19b as a mask so that the second lower metal layers 19a are left only under the second upper metal layers 19b, as shown in FIG. 15. Each left second lower metal layer 19a and the second upper metal layer 19b formed on the entire upper surface of the second lower metal layer 19a construct the second upper wiring 19.

Figure 16:
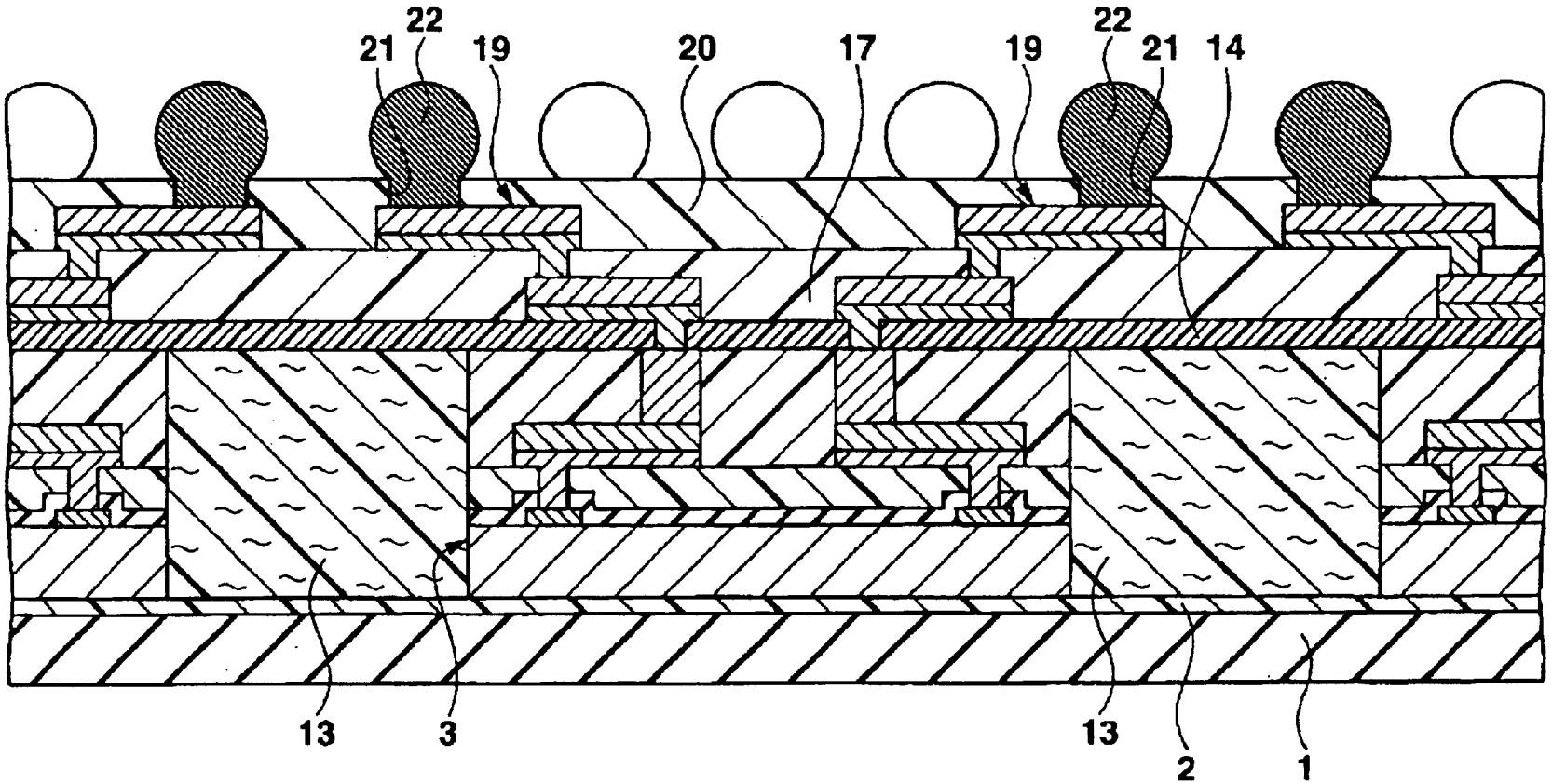
FIG. 16 is a sectional view of the pre-device in a manufacturing step following FIG. 15.

As shown in FIG. 16, the third upper insulating film 20 made of epoxy resin or polyimide is formed on the upper surfaces of the second upper wirings 19 and second upper insulating film 17 by screen printing or spin coating. The third upper insulating film 20 has the opening portions 21 at positions corresponding to the connection pad portions of the second upper wirings 19. The solder balls 22 are formed in and above the opening portions 21 and connected to the connection pad portions of the second upper wirings 19.

Figure 17:
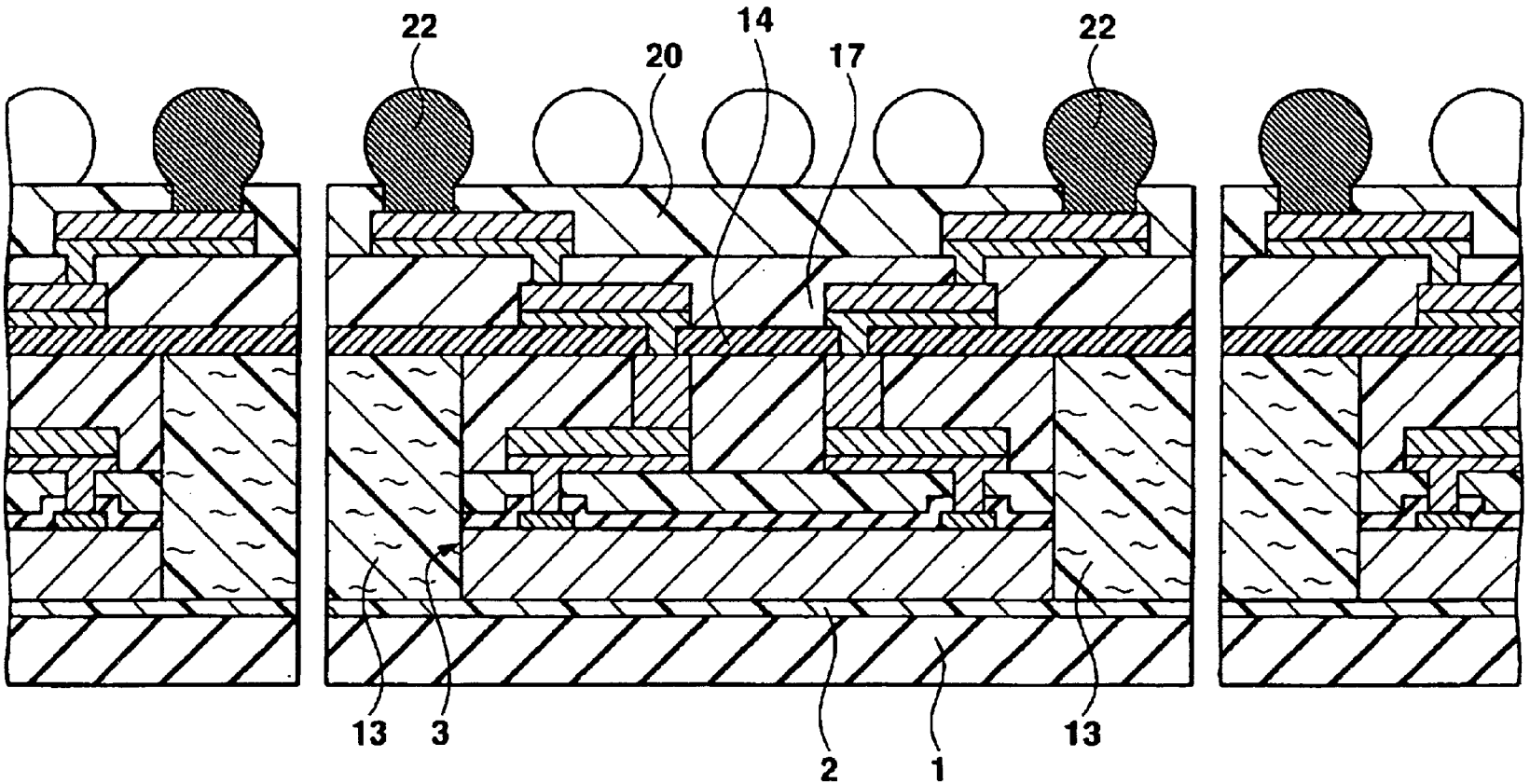
FIG. 17 is a sectional view of the pre-device in a manufacturing step following FIG. 16.

As shown in FIG. 17, the three insulating films 20, 17, 14, the insulating member 13, the adhesive layer 2, and the base plate 1 are cut between the adjacent semiconductor structures 3 to obtain a plurality of semiconductor devices shown in FIG. 1.

In the semiconductor device thus manufactured, the first lower metal layer 16a and first upper metal layer 16b connected to each columnar electrode 11 of the semiconductor structure 3 are formed by electroless plating (or sputtering) and electroplating, respectively. The second lower metal layer 19a and second upper metal layer 19b connected to the connection pad portion of each first upper wiring 16 are formed by electroless plating (or sputtering) and electroplating, respectively. For this reason, conductive connection between each columnar electrode 11 and a corresponding first upper wiring 16 and conductive connection between each first upper wiring 16 and a corresponding second upper wiring 19 in the semiconductor structure 3 can reliably be ensured.

In the above manufacturing method, the plurality of semiconductor structures 3 are arranged on the adhesive layer 2 of the base plate 1. For the plurality of semiconductor structures 3, the insulating member 13, the first to third upper insulating films 14, 17, and 20, the first and second lower metal layers 16a and 19a, the first and second upper metal layers 16b and 19b, and the solder balls 22 are formed at once. After that, the semiconductor structures 3 are separated to obtain the plurality of semiconductor devices. Hence, the manufacturing step can be simplified.

Additionally, the plurality of semiconductor structures 3 can be transported together with the base plate 1. This also simplifies the manufacturing step. When the outer size of the base plate 1 is constant, a single transport system can commonly be used independently of the outer size of the semiconductor device to be manufactured.

In the above manufacturing method, as shown in FIG. 9, the semiconductor structure 3 of CSP type, which has the wirings 10 and columnar electrodes 11, is bonded to the adhesive layer 2. The cost can be reduced as compared to a case wherein, e.g., a normal semiconductor chip having the connection pads 5 and insulating film 6 on the silicon substrate 4 is bonded to the adhesive layer 2, and wirings and columnar electrodes are formed on a sealing film formed around the semiconductor chip.

For example, assume that the base plate 1 before cutting has an almost circular shape having a predetermined size, like a silicon wafer. In this case, if wirings and columnar electrodes are formed on a sealing film formed around a semiconductor chip bonded to the adhesive layer 2, the process area increases. In other words, since a low-density process is executed, the number of processed wafers per cycle decreases. This decreases the throughput and increases the cost.

To the contrary, in the manufacturing method described above, the semiconductor structure 3 of CSP type, which has the wirings 10 and columnar electrodes 11, is bonded to the adhesive layer 2, and then, building-up is executed. Although the number of processes increases, the efficiency becomes high because a high-density process is executed until formation of the columnar electrodes 11. For this reason, the total cost can be decreased even in consideration of the increase in number of processes.

In the above-described embodiment, the solder balls 22 are arrayed in an accurate or non accurate matrix pattern in correspondence with the entire surfaces of the semiconductor structures 3 and insulating member 13. However, the solder balls 22 may be arranged only on a region corresponding to the insulating member 13 around the semiconductor structure 3. Alternately, the solder balls 22 may be formed not totally around the semiconductor structure 3 but on only one to three sides of the four sides of the semiconductor structure 3. In this case, the insulating member may be arranged on only a side where the solder balls 22 are to be formed.

(First Modification of Manufacturing Method)

Figure 18:
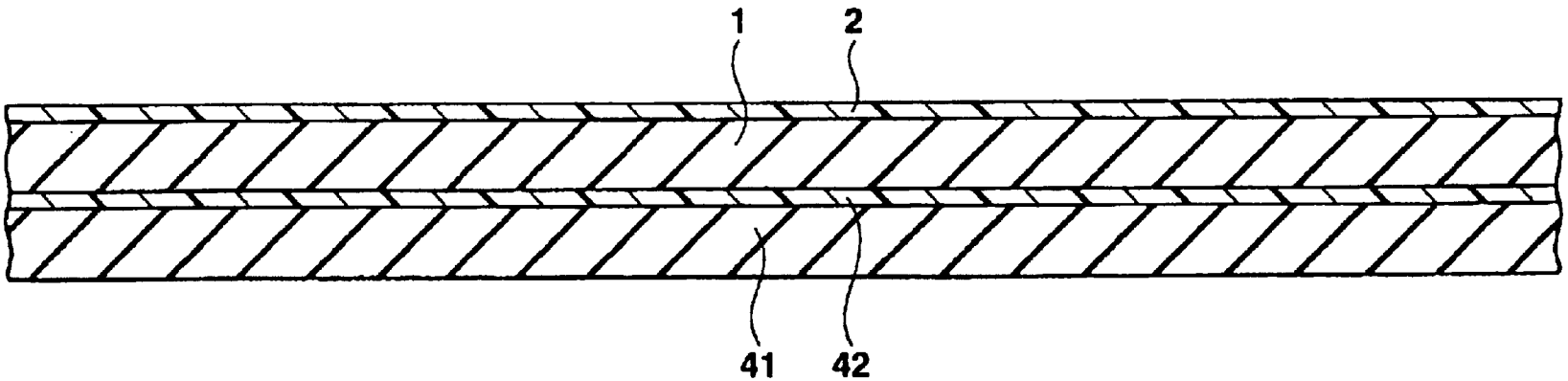
FIG. 18 is a sectional view of an initially prepared base plate according to the first modification of the method of manufacturing the semiconductor device shown in FIG. 1.

The first modification of the method of manufacturing the semiconductor device shown in FIG. 1 will be described next. As shown in FIG. 18, an adhesive layer 42 formed of a UV curing adhesive sheet is bonded to the entire upper surface of a base plate 41 formed of a UV transmitting transparent resin plate or a glass plate. The above-described base plate 1 and adhesive layer 2 are bonded to the upper surface of the adhesive layer 42.

Figure 19:
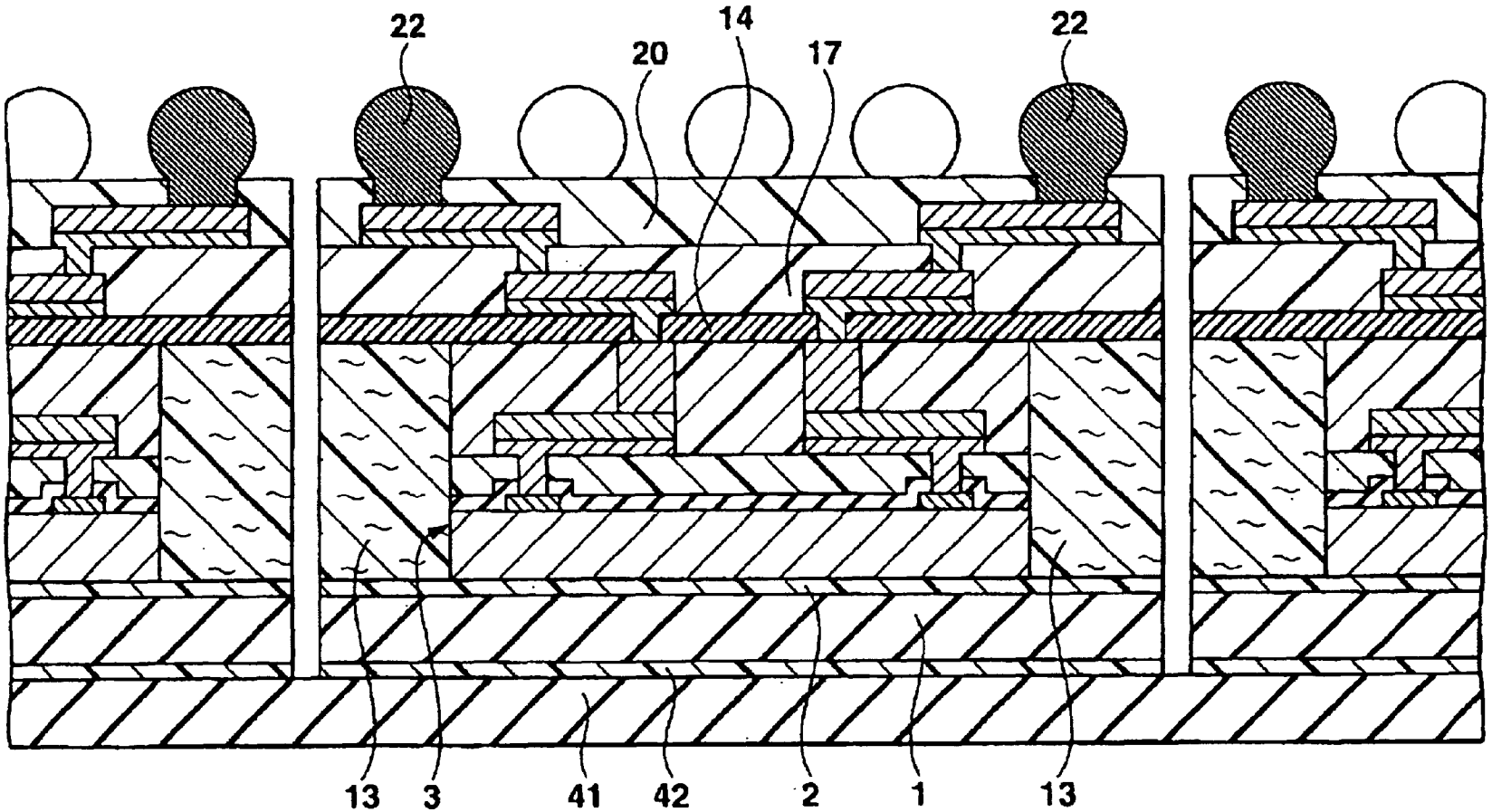
FIG. 19 is a sectional view of the pre-device in steps of manufacturing main parts in the first modification shown in FIG. 18.

After the manufacturing steps shown in FIGS. 9 to 16 are executed, as shown in FIG. 19, the three insulating films 20, 17, and 14, the insulating member 13, the adhesive layer 2, the base plate 1, and the adhesive layer 42 are cut while leaving another base plate 41. The lower surface of another base plate 41 is irradiated with UV rays to cure the adhesive layer 42 so that the adhesion of the adhesive layer 42 to the lower surface of the cut base plate 1 decreases. The semiconductor devices separated into chips on the adhesive layer 42 are removed and picked up one by one, thereby obtaining the plurality of semiconductor devices shown in FIG. 1.

In this manufacturing method, in the state shown in FIG. 19, the semiconductor devices separated into chips on the adhesive layer 42 do not come apart. Hence, in mounting, each semiconductor device can be removed and picked up onto a circuit board (not shown) without using any dedicated semiconductor device mounting tray. In addition, when the adhesive layer 42 which remains on the upper surface of another base plate 41 and whose adhesion has decreased is removed, the base plate 41 can be reused. Furthermore, when another base plate 41 has a predetermined outer size, a single transport system can commonly be used independently of the outer size of the semiconductor device to be manufactured.

A normal dicing tape which is expanded to detach semiconductor devices may be used as another base plate 41. In this case, the adhesive layer need not be a UV curing layer. Another base plate 41 may be removed by polishing or etching.

(Second Modification of Manufacturing Method)

Figure 20:
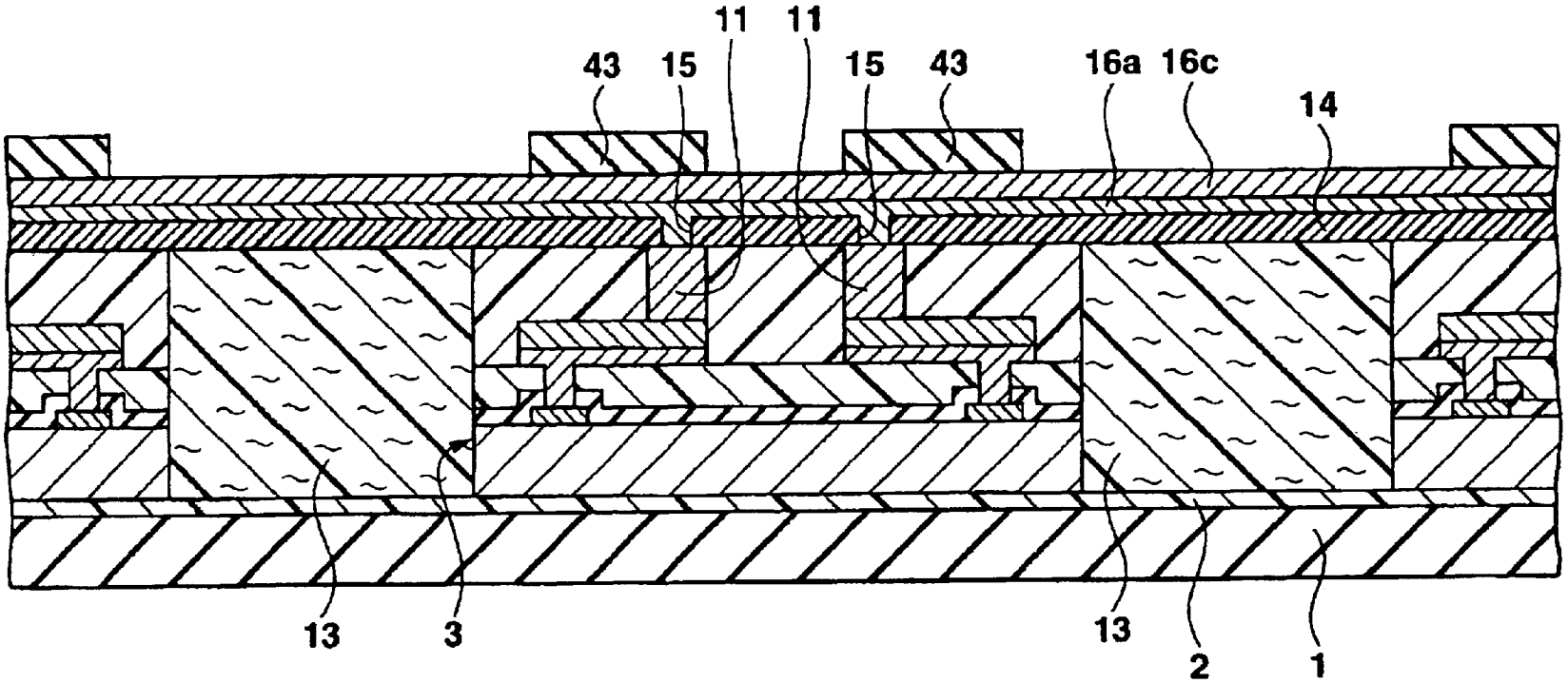
FIG. 20 is a sectional view of the pre-device in steps of manufacturing main parts according to the second modification of the method of manufacturing the semiconductor device shown in FIG. 1.

The second modification of the method of manufacturing the semiconductor device shown in FIG. 1 will be described next. In this manufacturing method, after the manufacturing step shown in FIG. 11, the first lower metal layer 16a is formed by electroless plating on the entire upper surface of the first upper insulating film 14 including the upper surfaces of the columnar electrodes 11 exposed through the opening portions 15, as shown in FIG. 20. Next, copper electroplating is executed using the first lower metal layer 16a as a plating current path to form a first upper metal formation layer 16c on the entire upper surface of the first lower metal layer 16a. A resist film 43 is formed and patterned on the upper surface of the first upper metal formation layer 16c in correspondence with the first upper wiring formation regions.

Figure 21:
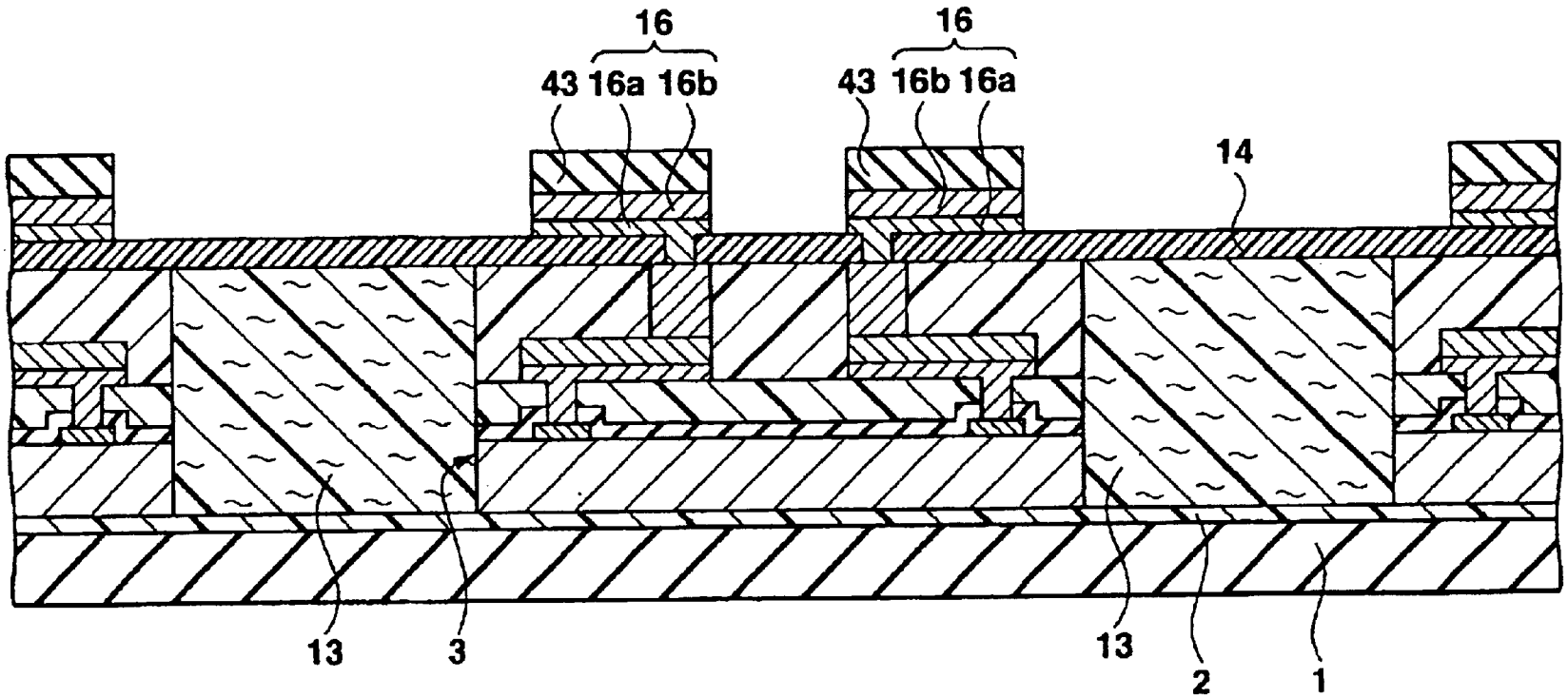
FIG. 21 is a sectional view of a manufacturing step following FIG. 20.

Unnecessary portions of the first upper metal formation layer 16c and first lower metal layer 16a are removed by etching using the resist film 43 as a mask so that the first upper wirings 16 each formed of the first upper metal formation layer 16c and first lower metal layer 16a are left only under the resist films 43, as shown in FIG. 21. After that, the resist films 43 is removed. The second upper wirings 19 may be formed in accordance with the same forming method as described above.

The base plate 1 shown in FIG. 9 or another base plate 41 shown in FIG. 19 may have a tray shape. That is, the base plate is formed into a saucer shape in which the region where the semiconductor structures 3 are arrayed is recessed with respect to the peripheral portion. A metal layer serving as a plating current path is formed on the upper surface of the peripheral portion that surrounds the array region of the semiconductor structures 3 in the tray-shaped base plate. Electroplating may be executed by connecting the metal layer serving as a plating current path and the lower metal layer (16a or 19a) serving as a plating current path by a conductive member. In this case, when the outer size of the tray is made constant, a single manufacturing apparatus can be used, and the efficiency can be increased even when the size of the semiconductor device to be manufactured changes.

(Third Modification of Manufacturing Method)

Figure 22:
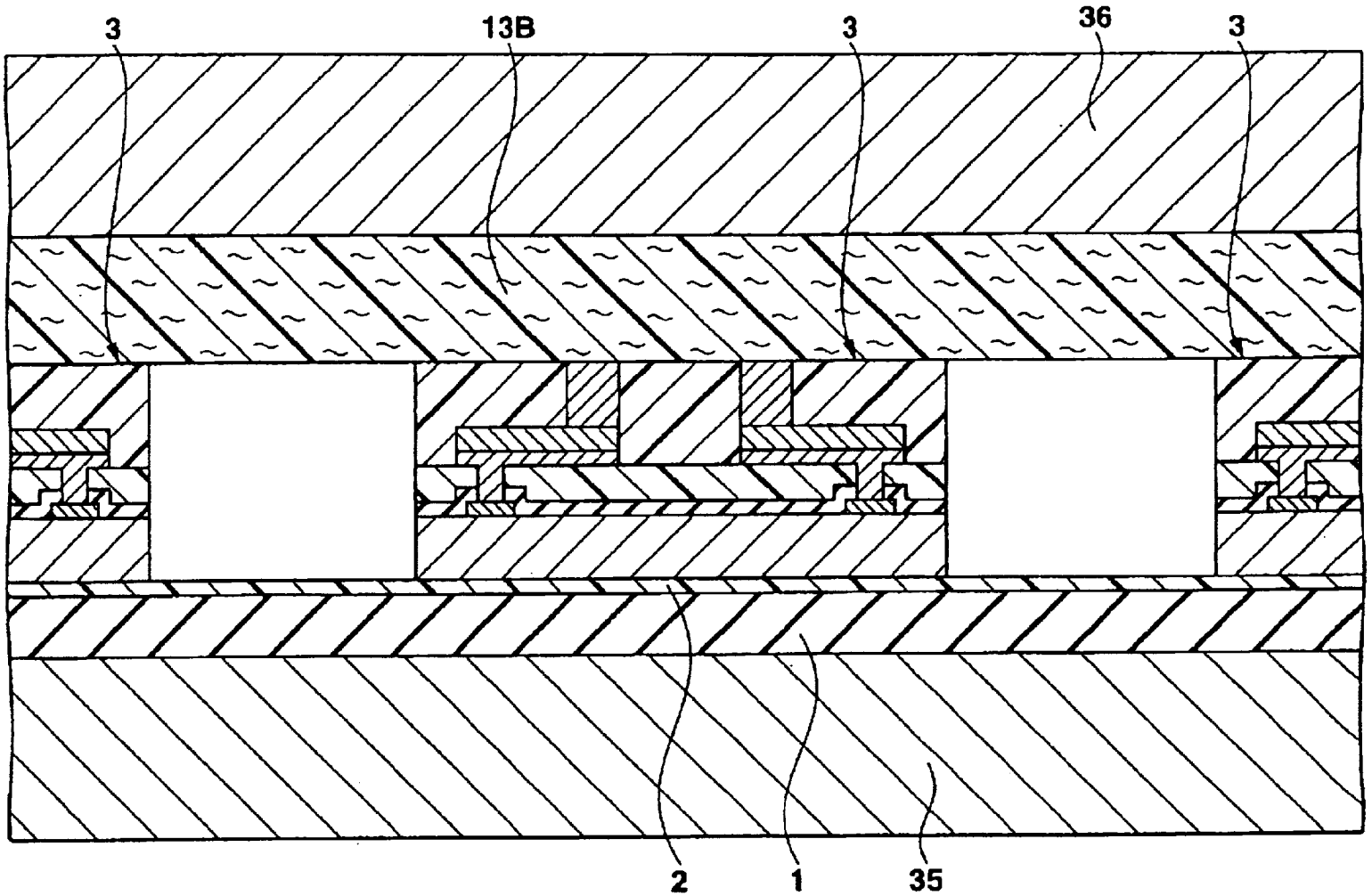
FIG. 22 is a sectional view of the pre-device in steps of manufacturing main parts according to the third modification of the method of manufacturing the semiconductor device shown in FIG. 1.

The third modification of the method of manufacturing the semiconductor device shown in FIG. 1 will be described next. In this manufacturing method, as shown in FIG. 22, a sheet-shaped insulating material 13B made of a thermosetting resin such as epoxy resin or BT resin that contains a reinforcing material such as a fiber or filler is arranged on the plurality of semiconductor structures 3 formed on the adhesive layer 2 on the base plate 1. In this state, a space is formed between the semiconductor structures 3 in a semi-set state.

Next, heating and pressing are performed by using the pair of heating/pressing plates 35 and 36 while setting the upper surface of the semiconductor structure 3 as a press limit surface. Accordingly, the thermosetting resin in the sheet-shaped insulating material 13B is pushed into the space between the semiconductor structures 3 and onto the adhesive layer 2 outside the semiconductor structures 3 arranged at the outermost positions together with the reinforcing material. As in the case shown in FIG. 10, the insulating member 13 having an upper surface almost flush with that of the semiconductor structure 3 is formed.

(Fourth Modification of Manufacturing Method)

Figure 23:
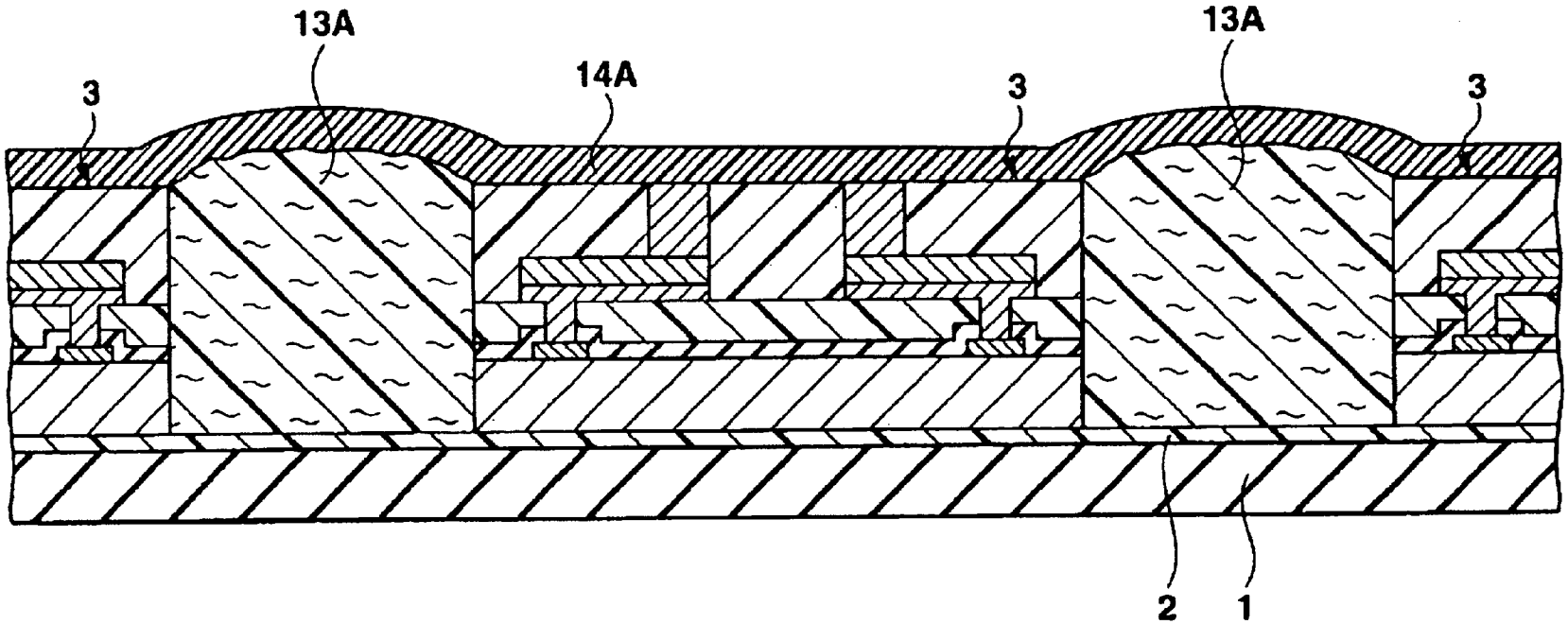
FIG. 23 is a sectional view of the pre-device in steps of manufacturing main parts according to the fourth modification of the method of manufacturing the semiconductor device shown in FIG. 1.

The fourth modification of the method of manufacturing the semiconductor device shown in FIG. 1 will be described next. In this manufacturing method, after the manufacturing step shown in FIG. 9, a sheet-shaped first upper insulating film material 14A made of a photosensitive resin such as epoxy resin or Cardo-type resin is temporarily bonded to the upper surfaces of the plurality of semiconductor structures 3 and the upper surface of the insulating material 13A by using a laminator, as shown in FIG. 23. In this case, the photosensitive resin that forms the sheet-shaped first upper insulating film material 14A preferably has a relatively low flowability.

Next, the first upper insulating film material 14A is temporarily cured by irradiating it with light. This temporary curing is executed because the thermosetting resin in the insulating material 13A should not overflow onto the semiconductor structures 3, and the photosensitive resin in the insulating material 13A should not mix with the photosensitive resin of the first upper insulating film material 14A.

Figure 24:
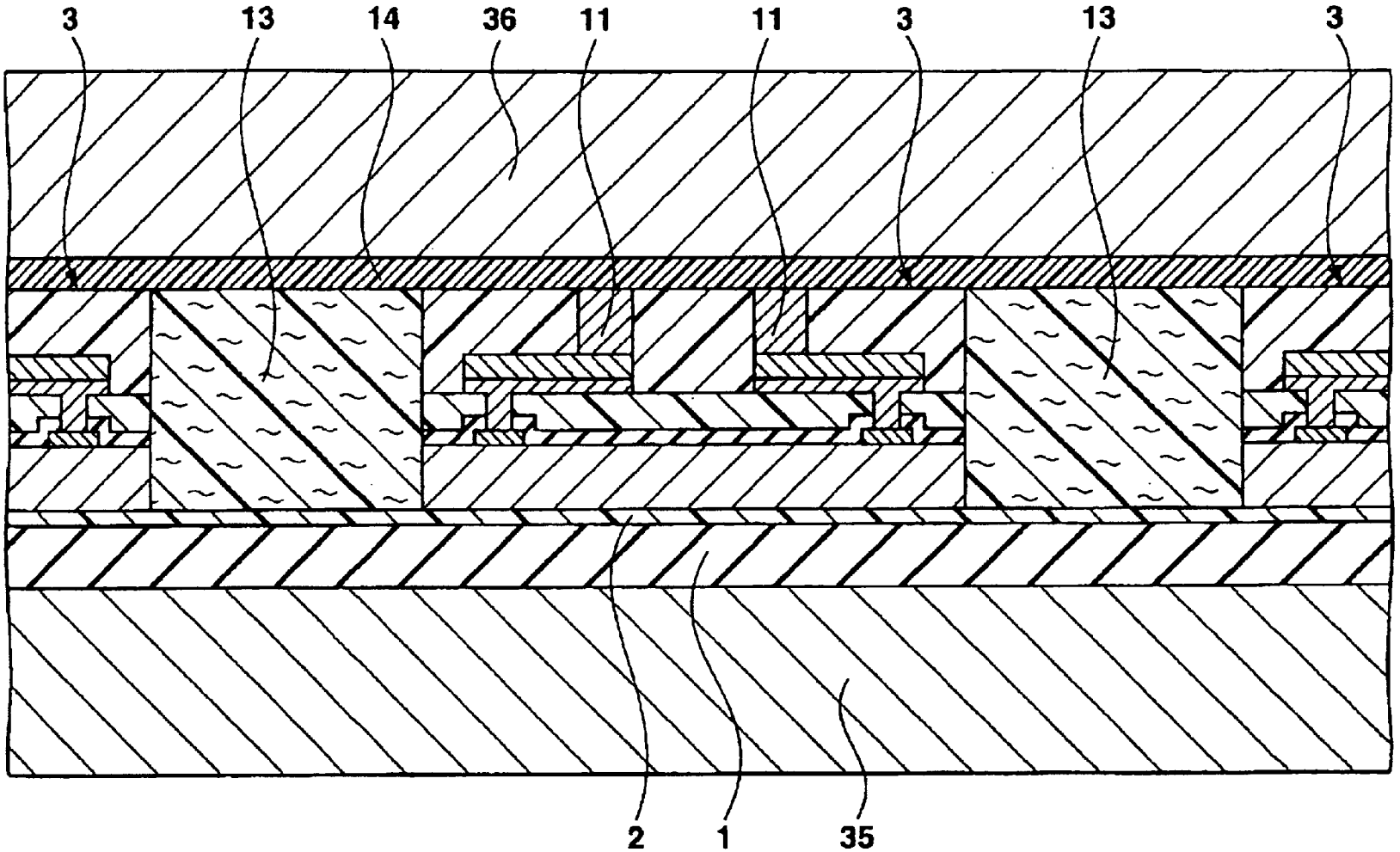
FIG. 24 is a sectional view of a manufacturing step following FIG. 23.

As shown in FIG. 24, heating and pressing are performed by using the pair of heating/pressing plates 35 and 36 while setting the upper surface of the upper insulating film material 14A as a press limit surface. Accordingly, the insulating member 13 having an upper surface almost flush with that of the semiconductor structure 3 is formed on the upper surface of the adhesive layer 2 between the semiconductor structures 3 and outside those arranged at the outermost positions. In addition, the first upper insulating film 14 is formed on the entire upper surfaces of the semiconductor structures 3 and insulating member 13 which are almost flush with each other.

In the heating/pressing process of this case, the semiconductor structures 3 are pressed via the first upper insulating film material 14A made of a photosensitive resin. For this reason, stress applied to the semiconductor structures 3 can be reduced. The first upper insulating film 14 made of a photosensitive resin has already been irradiated with light for temporary curing. Hence, the opening portions 15 (FIG. 11) are formed in the first upper insulating film 14 at positions corresponding to the central portions of the upper surfaces of the columnar electrodes 11 not by photolithography but by laser machining.

(Second Embodiment)

Figure 25:
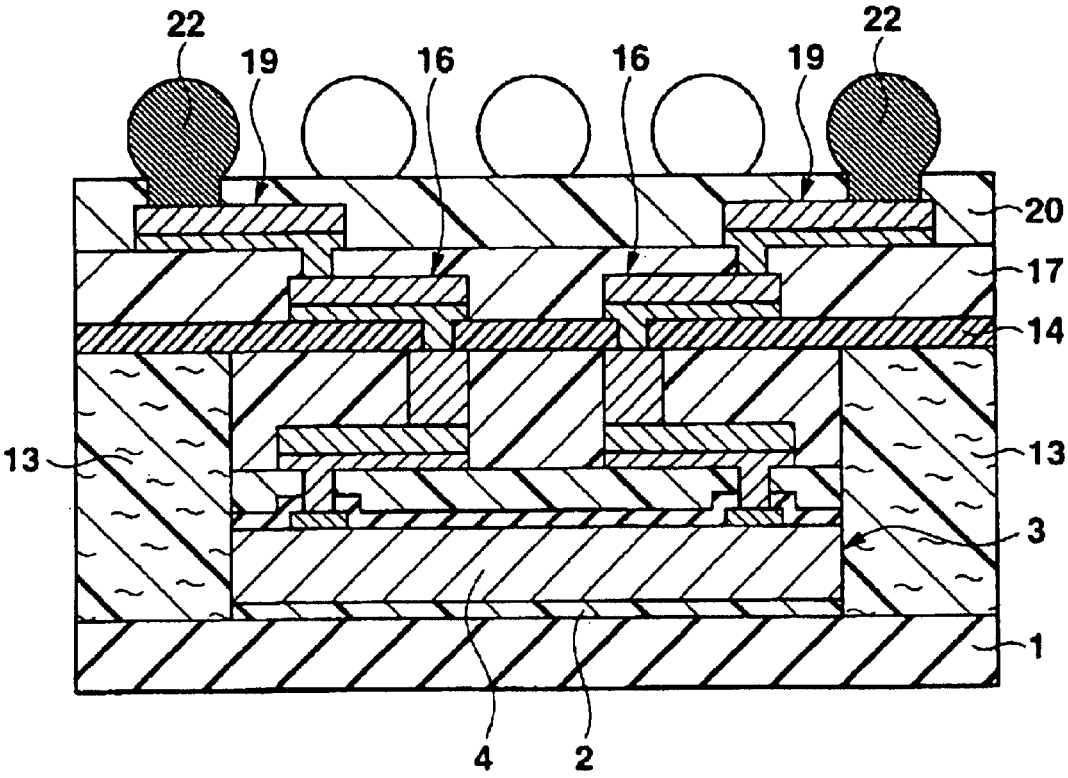
FIG. 25 is a sectional view of a semiconductor device according to the second embodiment of the present invention.

In the manufacturing step shown in FIG. 9, instead of arranging, under a silicon substrate 4, an adhesive layer 2 common to a plurality of semiconductor structures 3, a plurality of adhesive layers 2 are arranged in correspondence with the semiconductor structures 3. When the adhesive layers 2 are bonded to predetermined portions on the upper surface of a base plate 1, the lower surface of an insulating member 13 is directly bonded to the upper surface of the base plate 1, in the manufacturing step shown in FIG. 10. Hence, a semiconductor device according to the second embodiment of the present invention shown in FIG. 25 is obtained.

In a semiconductor device thus obtained, for example, the lower surface of the silicon substrate 4 is bonded to the upper surface of the base plate 1 via the adhesive layer 2, and additionally, the side surfaces of the silicon substrate 4 are connected to the upper surface of the base plate 1 via the insulating member 13. For these reasons, the bonding strength of the semiconductor structure 3 to the base plate 1 can be increased to some extend.

(Third Embodiment)

Figure 26:
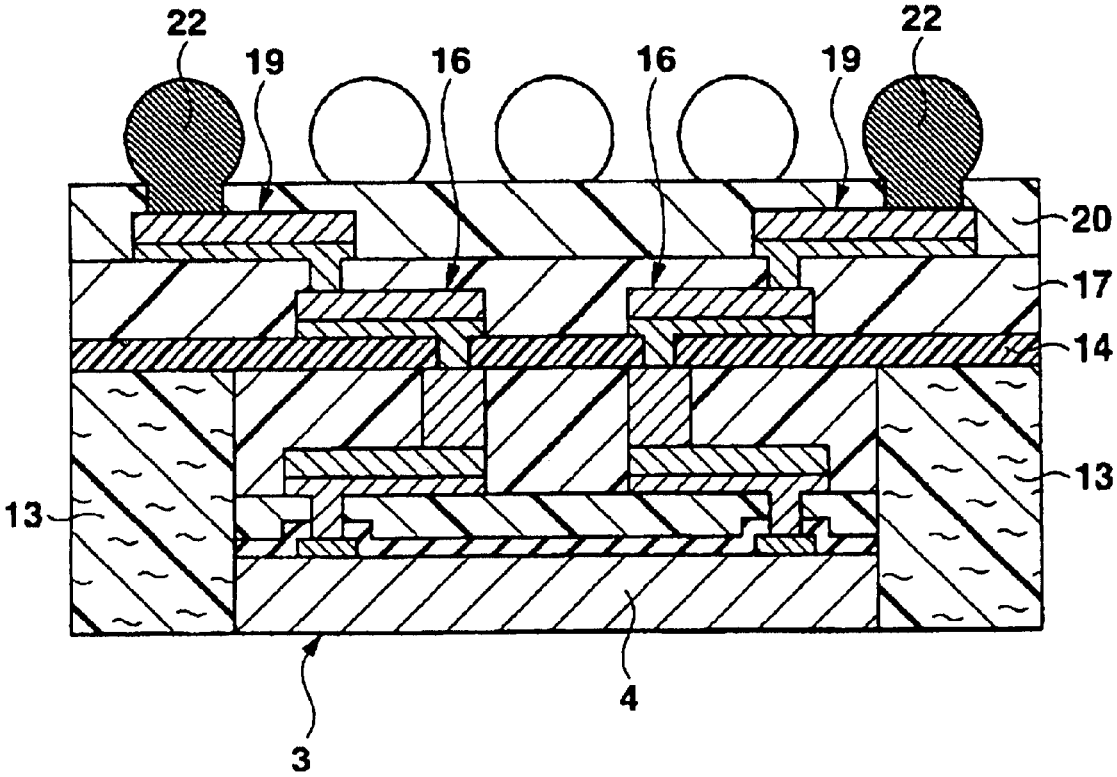
FIG. 26 is a sectional view of a semiconductor device according to the third embodiment of the present invention.

FIG. 26 is a sectional view of a semiconductor device according to the third embodiment of the present invention. This semiconductor device is different from that shown in FIG. 1 in that it has neither a base plate 1 nor an adhesive layer 2.

When the semiconductor device according to the third embodiment is to be manufactured, as shown in, e.g., FIG. 16, after solder balls 22 are formed, the base plate 1 and adhesive layer 2 are removed by etching and/or polishing. Next, three insulating films 20, 17, and 14 and an insulating member 13 are cut between semiconductor structures 3 adjacent to each other to obtain a plurality of semiconductor devices shown in FIG. 26. Since the semiconductor device thus manufactured has neither the base plate 1 nor the adhesive layer 2, the device can be thin.

(Fourth Embodiment)

Figure 27:
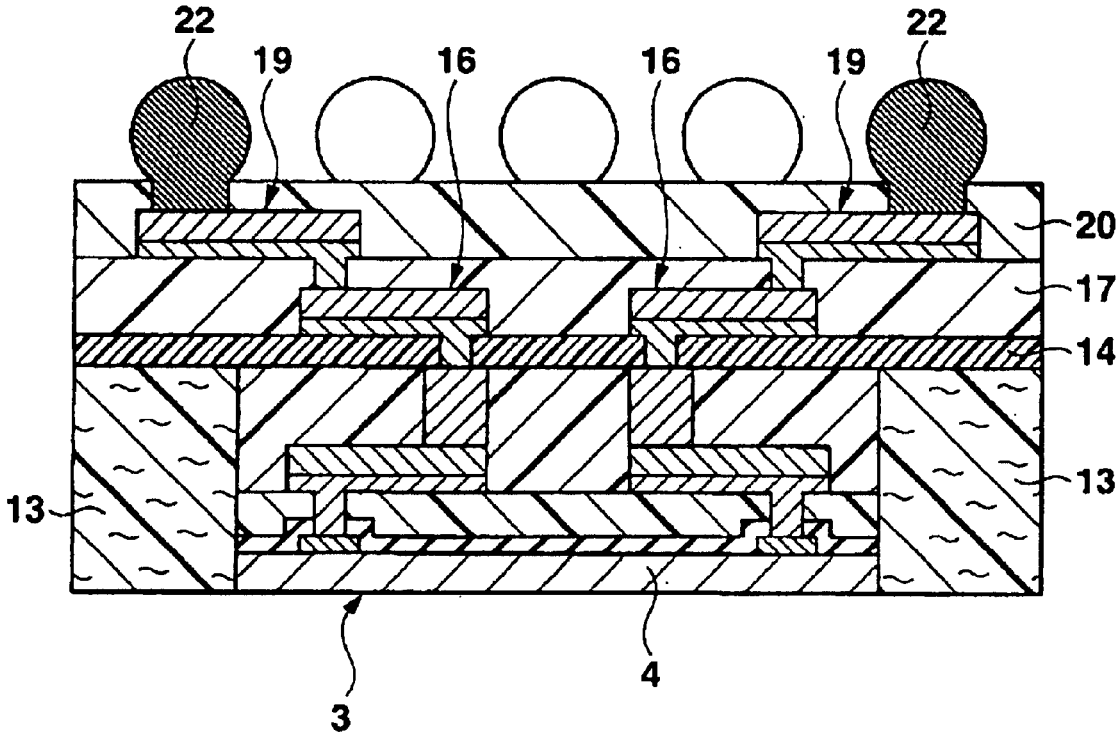
FIG. 27 is a sectional view of a semiconductor device according to the fourth embodiment of the present invention.

After a base plate 1 and adhesive layer 2 are removed by polishing or etching, the lower surface sides of a silicon substrate 4 and insulating member 13 are polished by an appropriate thickness. Three insulating films 20, 17, and 14 and an insulating member 13 are cut between semiconductor structures 3 adjacent to each other to obtain a plurality of semiconductor devices according to the fourth embodiment of the present invention shown in FIG. 27. The semiconductor device thus manufactured can be made thinner.

Before formation of solder balls 22, the base plate 1 and adhesive layer 2 may be removed by polishing or etching (the lower surface side of the silicon substrate 4 and insulating member 13 is appropriately polished, as needed). Next, the solder balls 22 are formed. Then, the three insulating films 20, 17, and 14 and the insulating member 13 may be cut between the semiconductor structures 3 adjacent to each other.

(Fifth Embodiment)

Figure 28:
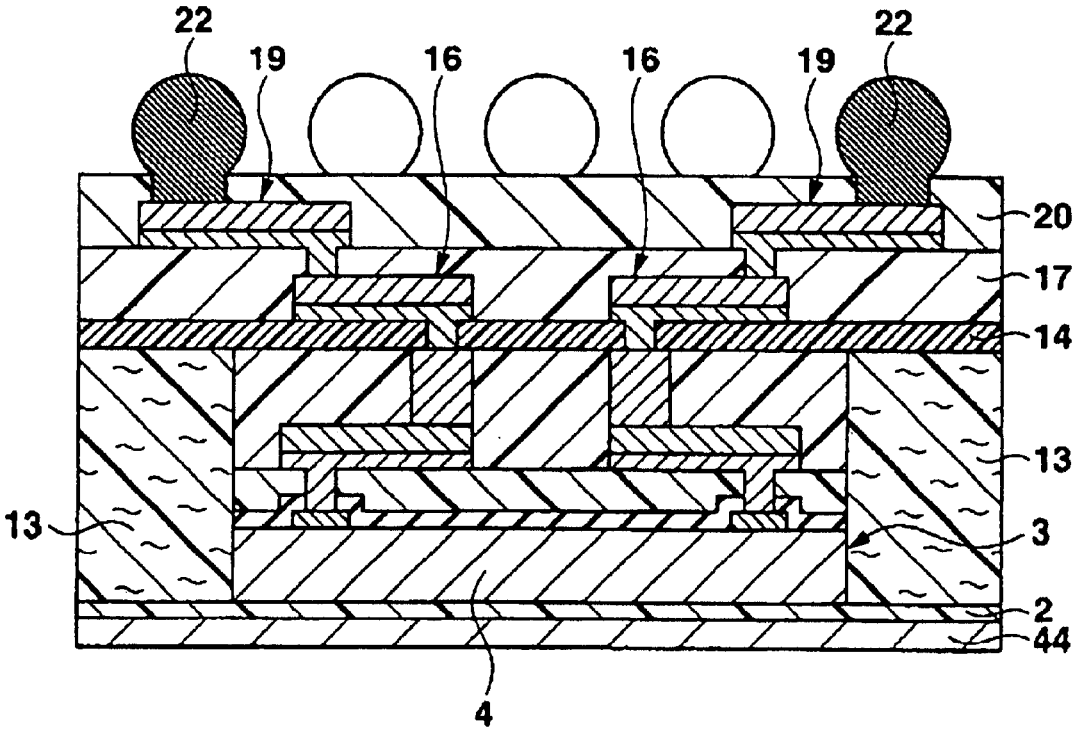
FIG. 28 is a sectional view of a semiconductor device according to the fifth embodiment of the present invention.

FIG. 28 is a sectional view of a semiconductor device according to the fifth embodiment of the present invention. This semiconductor device is different from that shown in FIG. 1 in that a heat dissipation metal layer 44 is bonded to the lower surface of an adhesive layer 2. The metal layer 44 is made of copper foil having a thickness of several ten μm.

When the semiconductor device according to the fifth embodiment is to be manufactured, as shown in, e.g., FIG. 16, after solder balls 22 are formed, a base plate 1 is removed by polishing or etching. Next, the metal layer 44 is bonded to the entire lower surface of an adhesive layer 2. Three insulating films 20, 17, and 14, an insulating member 13, the adhesive layer 2, and the metal layer 44 are cut between semiconductor structures 3 adjacent to each other to obtain a plurality of semiconductor devices shown in FIG. 28.

In this embodiment, the adhesive layer 2 may also be removed by polishing or etching (the lower surface side of a silicon substrate 4 and the insulating member 13 is appropriately polished, as needed). Then, the metal layer 44 may be bonded to the lower surfaces of the silicon substrate 4 and insulating member 13 via a new adhesive layer.

(Sixth Embodiment)

Figure 29:
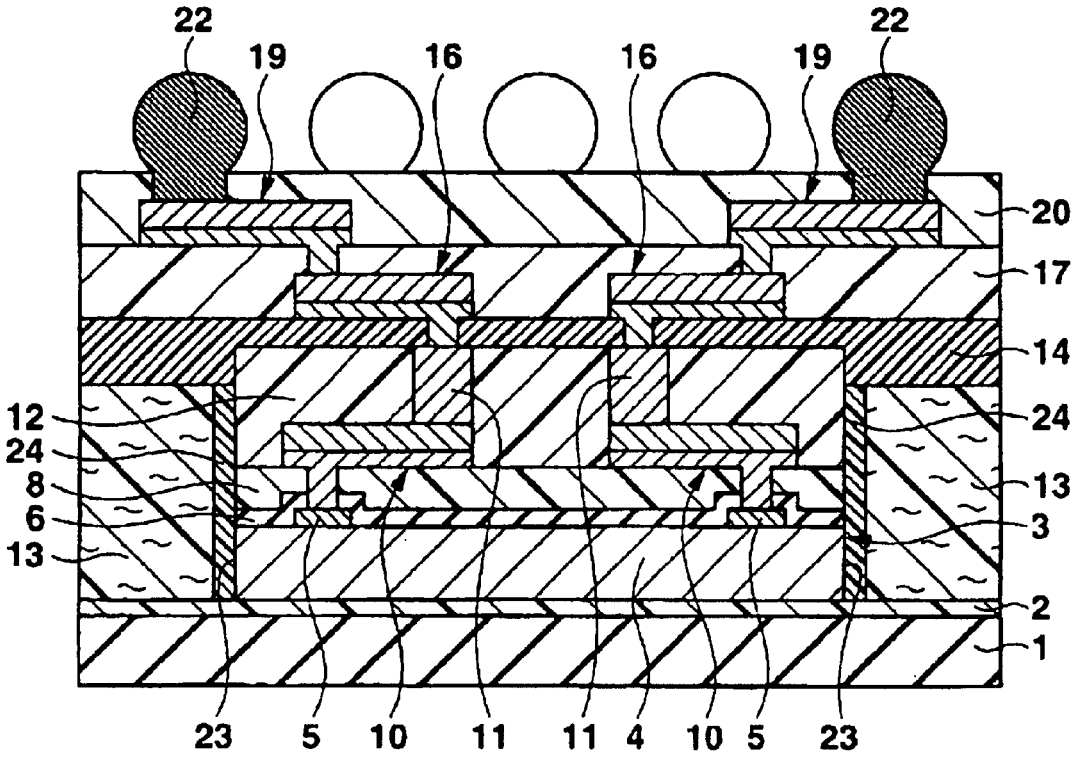
FIG. 29 is a sectional view of a semiconductor device according to the sixth embodiment of the present invention.

FIG. 29 is a sectional view of a semiconductor device according to the sixth embodiment of the present invention. This semiconductor device is largely different from that shown in FIG. 1 in that a first upper insulating film 14 is made of the same material as that of an insulating member 13, a gap 23 is formed between a semiconductor structure 3 and the insulating member 13, and an insulating film 24 made of a resin is formed in the gap 23.

Figure 30:
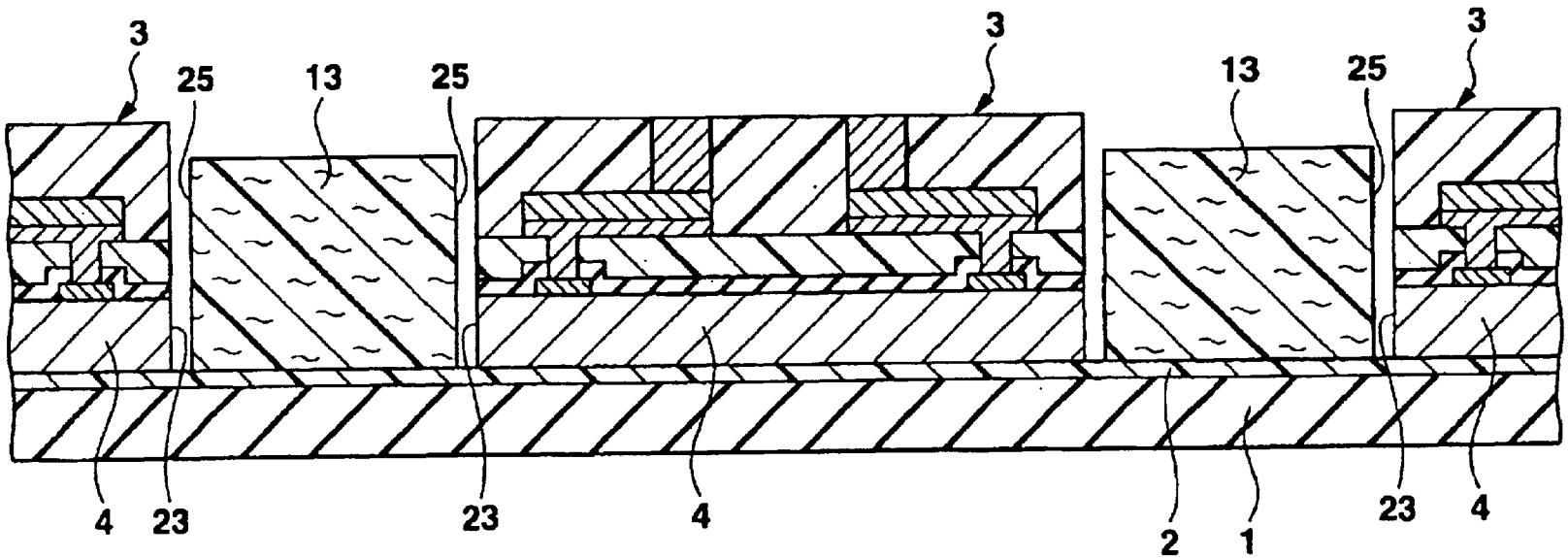
FIG. 30 is a sectional view showing a pre-device in steps of manufacturing main parts so as to explain a method of manufacturing the semiconductor device shown in FIG. 29.

An example of a method of manufacturing the semiconductor device will be described next. First, as shown in FIG. 30, the lower surface of the insulating member 13 having a matrix or lattice shape is bonded to predetermined portions of the upper surface of an adhesive layer 2 bonded to the upper surface of a base plate 1. The insulating member 13 is obtained by forming a plurality of rectangular opening portions 25 by die cutting or etching in a sheet-shaped insulating material (e.g., a prepreg) made of a thermosetting resin containing a reinforcing material such as a fiber or filler made of an inorganic matter. The planar size of each opening portion 25 is slightly larger than that of a semiconductor structure 3.

The lower surface of a silicon substrate 4 of each semiconductor structure 3 is bonded to the central portion of the upper surface of the adhesive layer 2 in each opening portion 25 of the insulating member 13. The insulating member 13 is slightly thinner than the semiconductor structure 3. For this reason, the upper surface of the insulating member 13 is located on a slightly lower side of the that of the semiconductor structure 3. In addition, since the planar size of the opening portion 25 is slightly larger than that of the semiconductor structure 3, the gap or interval 23 is formed between the insulating member 13 and the semiconductor structure 3.

Figure 31:
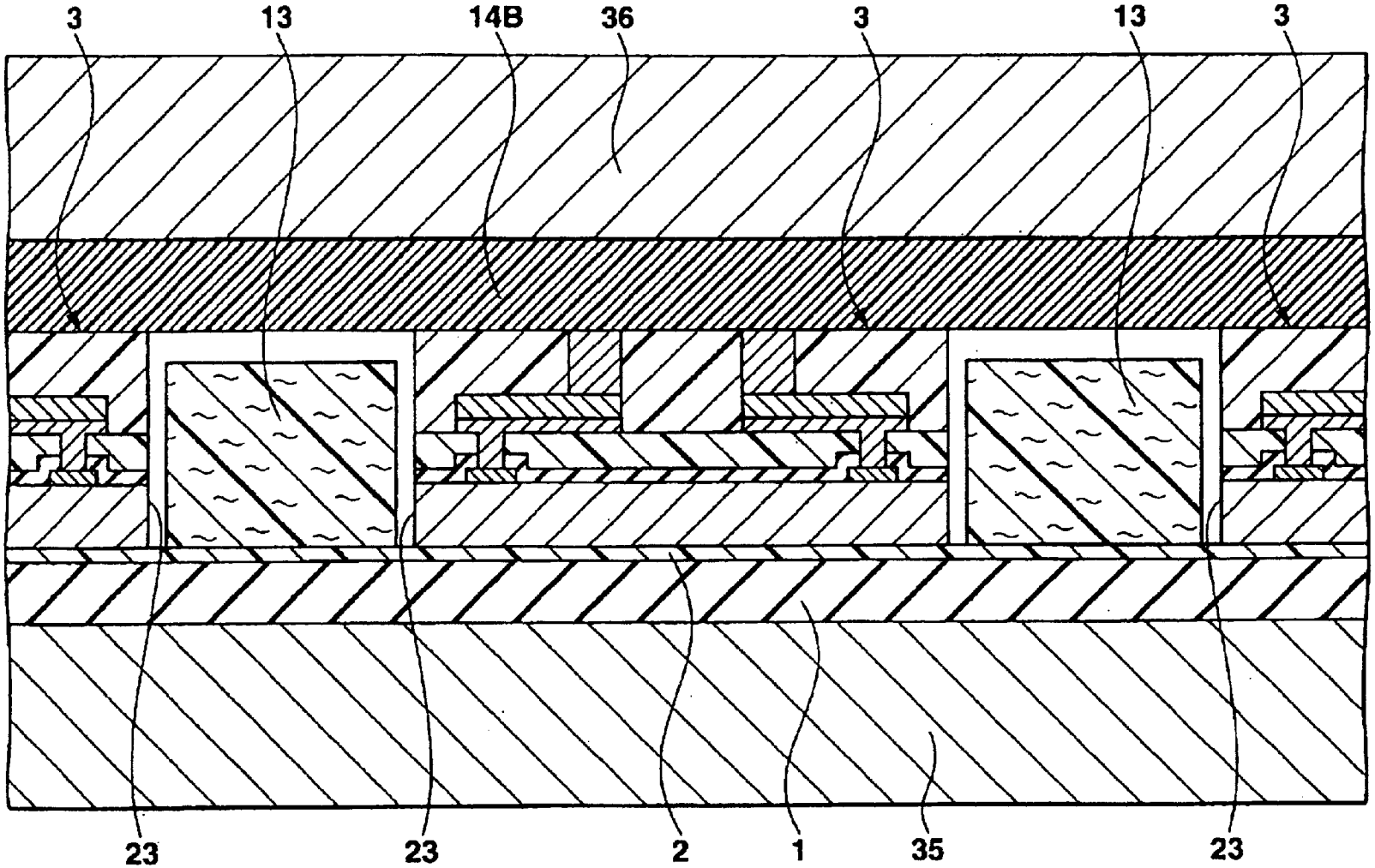
FIG. 31 is a sectional view of a manufacturing step following FIG. 30.

As shown in FIG. 31, a sheet-shaped first upper insulating film material or member (e.g., a prepreg) 14B made of a thermosetting resin containing a reinforcing material such as a fiber or filler is simply placed on the upper surfaces of the plurality of semiconductor structures 3 in a semi-set state. The interval 23 between the insulating member 13 and the semiconductor structure 3 is smaller than the diameter of the reinforcing material such as a fiber or filler in the first upper insulating film material 14B.

Figure 32:
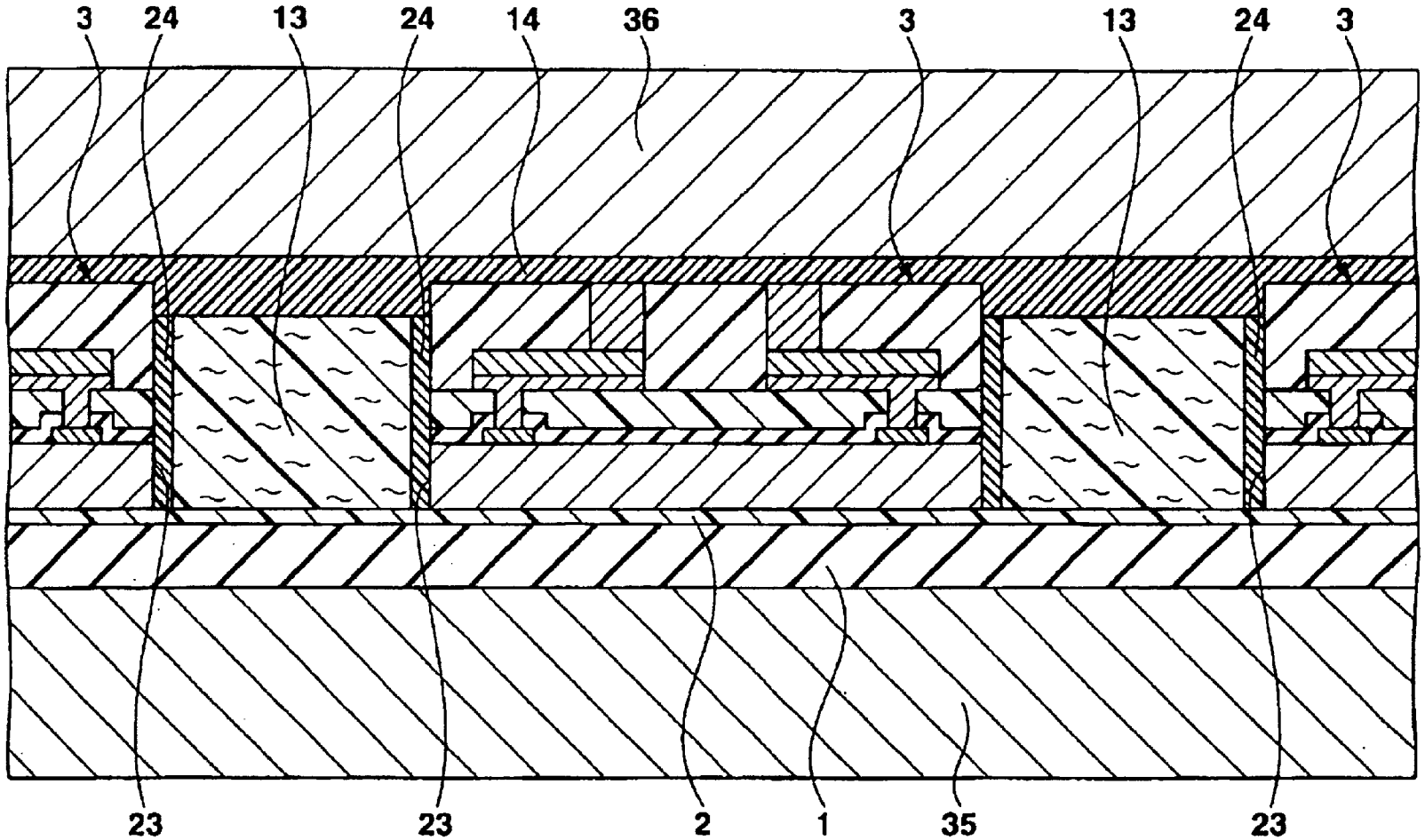
FIG. 32 is a sectional view of a manufacturing step following FIG. 31.

The first upper insulating film material 14B is heated and pressed by using a pair of heating/pressing plates 35 and 36. As a result, only the thermosetting resin in the first upper insulating film material 14B is pushed into the gap 23 between the insulating member 13 and the semiconductor structure 3 to form the insulating film 24, as shown in FIG. 32, because the diameter of the reinforcing material such as a fiber or filler in the first upper insulating film material 14B is larger than the interval between the insulating member 13 and the semiconductor structure 3. In addition, the first upper insulating film 14 made of the thermosetting resin containing the reinforcing material is formed on the upper surfaces of the insulating film 24, insulating member 13, and semiconductor structure 3.

In this case, when a virtual plane higher than the upper surface of the semiconductor structure 3 by an amount equal to the diameter of the reinforcing material in the first upper insulating film material 14B is defined as a press limit surface, the thickness of the first upper insulating film 14 on the semiconductor structure 3 becomes equal to the diameter of the reinforcing material in the first upper insulating film 14. The upper surface of the insulating member 13 is arranged on a slightly lower side of that of the semiconductor structure 3 because a virtual plane higher than the upper surface of the insulating member 13 by an amount equal to the diameter of the reinforcing material in the first upper insulating film material 14B should not be defined as a press limit surface. The upper surface of the first upper insulating film material 14B is pressed by the lower surface of the heating/pressing plate 36 on the upper side and therefore becomes a flat surface. Hence, the polishing step of planarizing the upper surface of the first upper insulating film 14 can be omitted.

Figure 33:
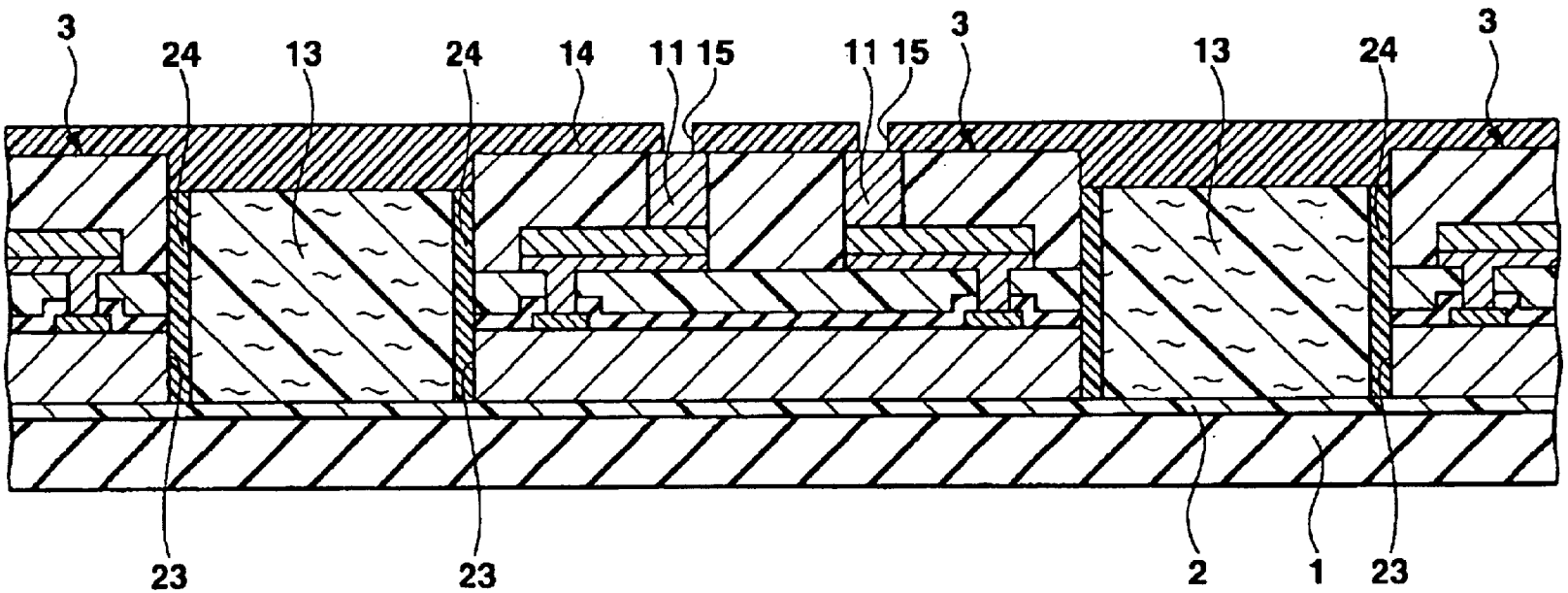
FIG. 33 is a sectional view of a manufacturing step following FIG. 32.

As shown in FIG. 33, since the first upper insulating film 14 contains the reinforcing materials, opening portions 15 are formed in the first upper insulating film 14 in correspondence with the central portions of the upper surfaces of columnar electrodes 11 by laser machining. The manufacturing steps shown in, e.g., FIGS. 12 to 17 are executed to obtain a plurality of semiconductor devices shown in FIG. 29.

(Seventh Embodiment)

Figure 34:
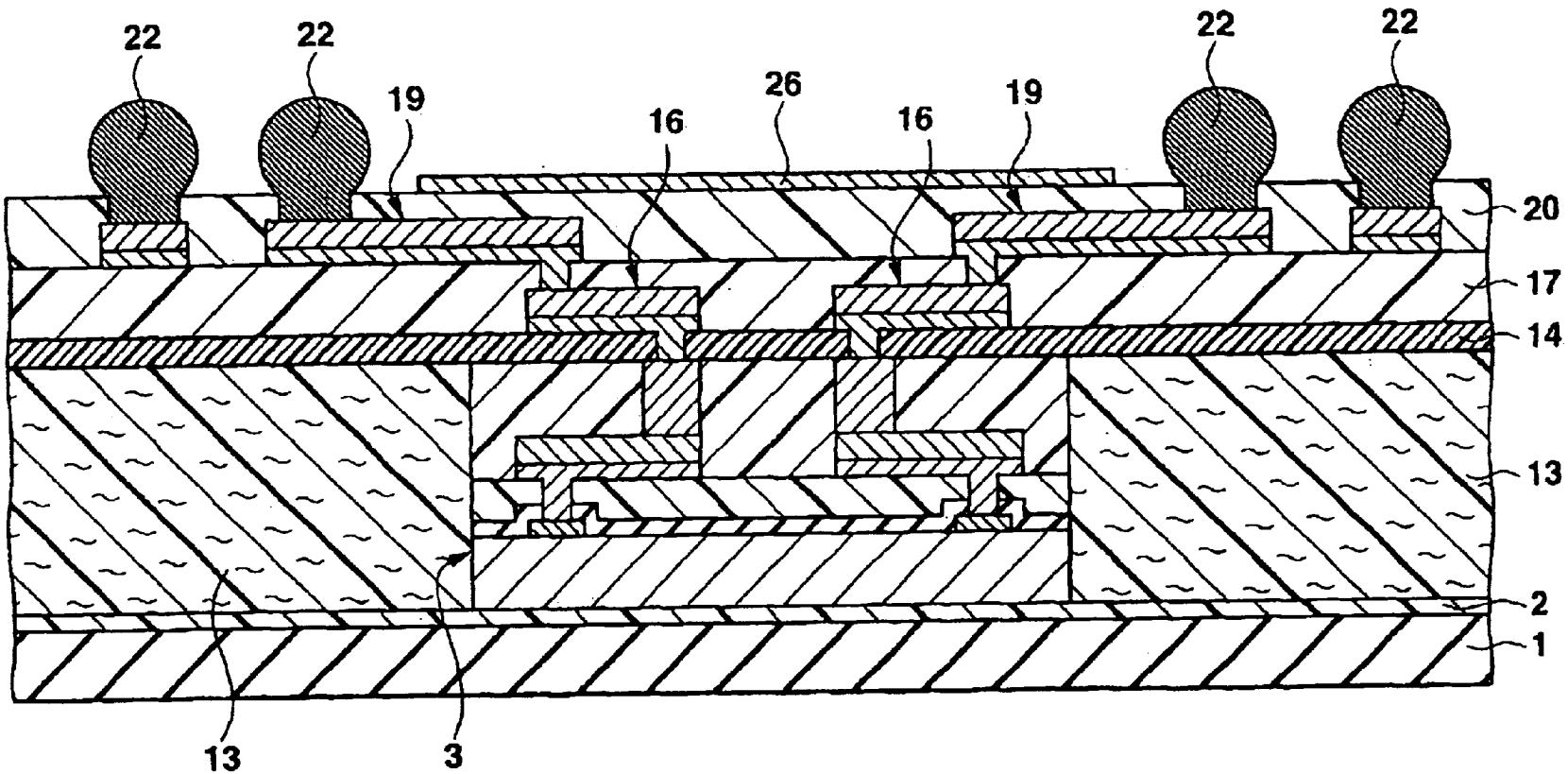
FIG. 34 is a sectional view of a semiconductor device according to the seventh embodiment of the present invention.

For example, in the device shown in FIG. 1, the solder balls 22 are arranged even on the third upper insulating film 20 above the semiconductor structure 3. However, the present invention is not limited to this. For example, as in the seventh embodiment of the present invention shown in FIG. 34, solder balls 22 may be arranged only on a third upper insulating film 20 above an insulating member 13. A light shielding film 26 which is made of a light shielding metal to prevent light incidence on the integrated circuit on a silicon substrate 4 may be formed on the third upper insulating film 20 above the semiconductor structure 3. The light shielding film 26 may be a metal sheet or may be formed by sputtering or electroless plating.

(Eighth Embodiment)

Figure 35:
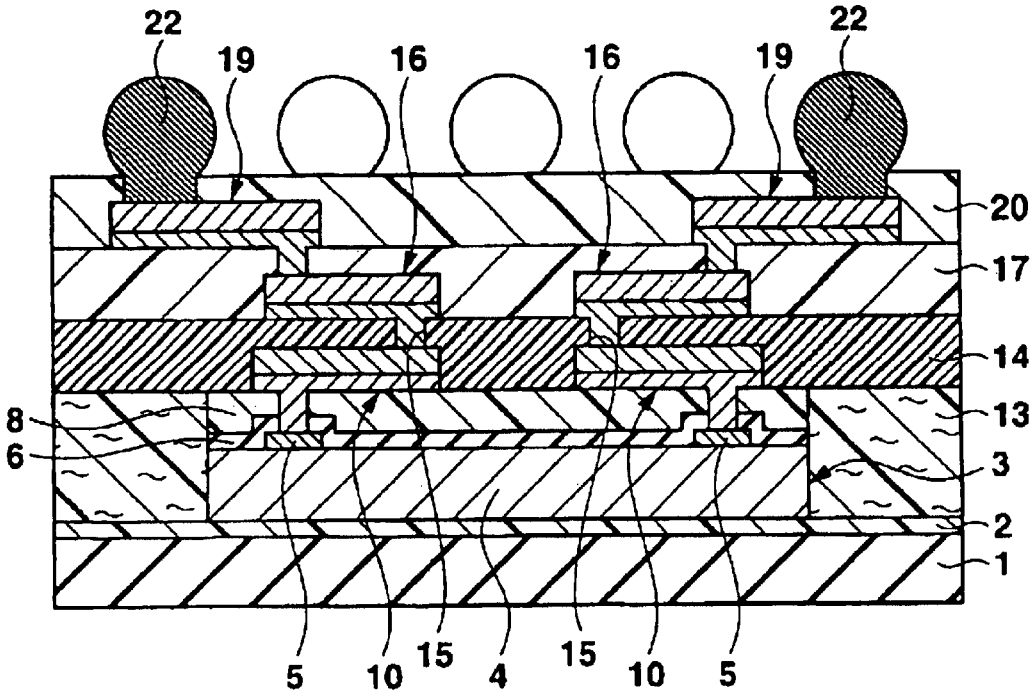
FIG. 35 is a sectional view of a semiconductor device according to the eighth embodiment of the present invention.

FIG. 35 is a sectional view of a semiconductor device according to the eighth embodiment of the present invention. This semiconductor device uses a semiconductor structure 3 having neither columnar electrodes 11 nor a sealing film 12, unlike the semiconductor structure 3 shown in FIG. 1. In this case, for example, when the manufacturing steps shown in FIGS. 23 and 24 are executed, an insulating member 13 having a rectangular frame shape is formed on the upper surface of an adhesive layer 2 around the semiconductor structure 3. In addition, a first upper insulating film 14 is formed on the upper surfaces of a protective film 8 and the insulating member 13, including wirings 10. Opening portions 15 are formed in the first upper insulating film 14 in correspondence with the connection pad portions of the wirings 10 by laser machining. First upper wirings 16 are connected to the connection pad portions of the wirings 10 through the opening portions 15.

The semiconductor structure 3 has neither the columnar electrodes 11 nor the sealing film 12. This will be described with referenced to, e.g., FIG. 23. In heating/pressing, the semiconductor structure 3 is pressed via a first upper insulating film material 14A made of a photosensitive resin. Hence, stress applied to the semiconductor structure 3 is reduced, and no problem is posed.

(Ninth Embodiment)

Figure 36:
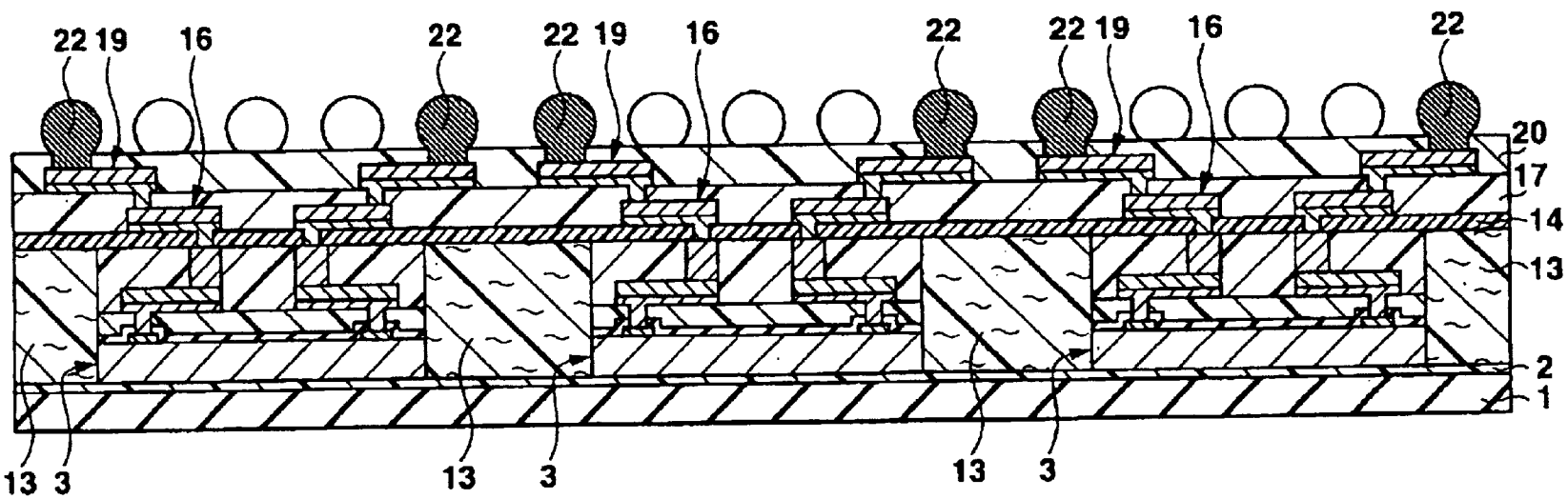
FIG. 36 is a sectional view of a semiconductor device according to the ninth embodiment of the present invention.

For example, in FIG. 17, the resultant structure is cut between the semiconductor structures 3 adjacent to each other. However, the present invention is not limited to this. The resultant structure may be cut for every two or more semiconductor structures 3. For example, as in the ninth embodiment of the present invention shown in FIG. 36, the resultant structure may be cut for every three semiconductor structures 3 to obtain a multi-chip module type semiconductor device. In this case, the three semiconductor structures 3 can be either of the same type or of different types.

(Other Embodiments)

In the above-described embodiments, the insulating member 13 is made of a thermosetting resin containing a reinforcing material. However, the present invention is not limited to this. The insulating member 13 may be made of only a thermosetting resin. Alternatively, the insulating member 13 may be made of only a thermoplastic resin such as liquid crystal polymer or PEET (polyetherketone).

Figure 37:
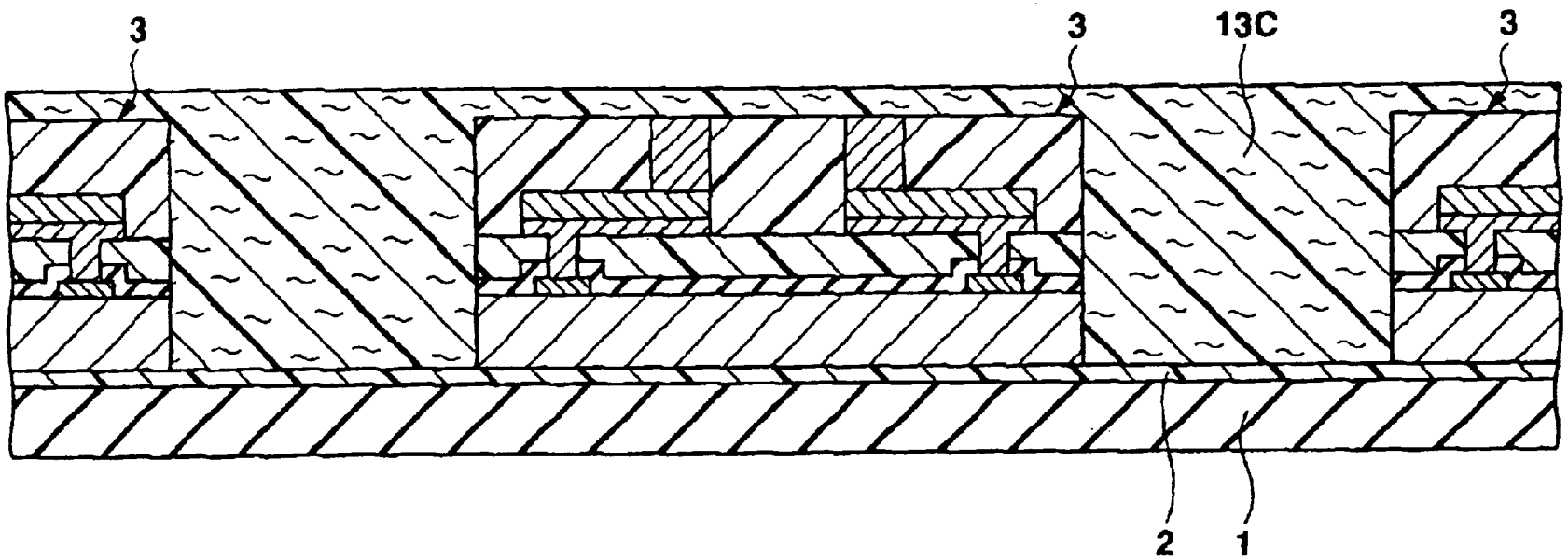
FIG. 37 is a sectional view showing a pre-device so as to explain a method of manufacturing a semiconductor device according to other embodiments of the present invention.

When the insulating member 13 is to be formed by using only a thermoplastic resin, a liquid thermoplastic resin may be printed by screen printing, as indicated by, e.g., 13A in FIG. 9. Alternatively, as indicated by, e.g., 13C in FIG. 37, a liquid thermoplastic resin may be applied by a coating method to cover the semiconductor structures 3. Then, the insulating member 13 may be formed between the semiconductor structures 3 by executing heating and pressing while defining the upper surfaces of the semiconductor structures 3 as a press limit surface.

For example, in the device shown in FIG. 1, the first upper wirings 16 are formed on the upper surface of the first upper insulating film 14 formed on the upper surfaces of the semiconductor structures 3 and insulating member 13. However, the present invention is not limited to this. The first upper wirings 16 may be formed on the upper surfaces of the semiconductor structures 3 and insulating member 13 without forming the first upper insulating film 14.

As described above, according to the present invention, the connection pad portions of at least some of the uppermost wirings are arranged on the insulating member formed on a side of the semiconductor structure. For this reason, even when the number of connection pad portions of the uppermost wirings increases, the necessary size and pitch can be ensured.

What is claimed is:

1. A semiconductor device comprising:

at least one semiconductor structure having a plurality of external connection portions on an upper surface;

an insulating member which is made of a resin containing reinforcing materials and arranged on a side of the semiconductor structure;

an insulating film which is formed on the upper surface of the semiconductor structure, except *for at least a portion of each of* the external connection portions, and on an upper surface of the insulating member; and a plurality of upper wirings, each of which has a connection pad portion which is located [on an upper side of] *above* the insulating film, and *each of which is* electrically connected to a corresponding one of the external connection portions of the semiconductor structure, the connection pad portion of at least one of the upper wirings being arranged above [an] *the* upper surface of the insulating member.

2. A device according to claim 1, wherein said at least one semiconductor structure includes a plurality of semiconductor structures.

3. A device according to claim 1, wherein the upper surface of the insulating member is substantially flush with [that] *the upper surface* of the semiconductor structure.

4. A device according to claim 1, wherein the upper surface of the insulating member is located [on a lower side of that] *below the upper surface* of the semiconductor structure.

5. A device according to claim 1, wherein the insulating film includes a resin and reinforcing materials contained in the resin.

6. A device according to claim 5, wherein another insulating film made of the same resin as [that of] the insulating film is formed between the semiconductor structure and the insulating member.

7. A device according to claim 1, wherein the insulating member has a frame shape having at least one opening portion, and the semiconductor structure is arranged in the opening portion.

8. A device according to claim 1, wherein the semiconductor structure comprises*:* a semiconductor substrate which has a plurality of connection pads on [the] *an* upper surface *thereof*,

[the] *another* insulating film, which has openings [to] *through* which the connection pads *of the semiconductor substrate* are exposed, and [is formed to cover] *which covers* the upper surface of the semiconductor substrate, a plurality of wirings, each of which has a connection pad portion that is *located above said another insulating film and is* electrically connected to a corresponding one of the connection [pad portions] *pads* of the semiconductor substrate through *one of* the [opening] *openings* of [the] *said another* insulating film,[and located on the insulating film, ]

a plurality of columnar electrodes, each of which is formed on *one of* the connection pad [portion] *portions* of the [wiring] *wirings* and [constructs] *forms one of* the external connection [portion] *portions of the semiconductor structure*, and a sealing film which is formed around each columnar electrode [on the semiconductor substrate] and the wirings of the semiconductor structure.

9. A device according to claim 1, wherein a solder ball is formed on the connection pad portion of the *at least one of the* upper [wiring located] *wirings arranged* above the upper surface of the insulating member.

10. A device according to claim 9, wherein [said plurality] *each* of the upper wirings [include] *includes* at least one upper side wiring [located on an upper side] and at least one lower side wiring located [on a lower side] *below the at least one upper side wiring*, and *the upper side wiring comprises the connection pad portion on which* the solder ball is formed. [on the connection pad portion of the upper side wiring located on the upper side.]

*11. A semiconductor device comprising:*

*a semiconductor structure including: (i) a semiconductor substrate, (ii) a plurality of connection pads provided on the semiconductor substrate, (iii) an insulating layer which covers a surface of the semiconductor substrate and which has openings to expose at least portions of the connection pads on the semiconductor substrate, (iv) a protective layer which is provided above the insulating layer, and which has openings corresponding to the openings in the insulating layer to expose at least portions of the connection pads, (v) a plurality of wirings, each of which includes a connection pad portion that is located above the protective layer and that is electrically connected to a corresponding one of the connection pads on the semiconductor substrate through one of the openings of the insulating layer and one of the openings in protective layer, (vi) a plurality of external electrodes, each of which is provided on a corresponding one of the connection pad portions, and (vii) a sealing film which is provided above the protective layer and around each of the external electrodes and the wirings;*

*an insulating member which is made of a resin containing reinforcing materials and arranged on a side of the semiconductor structure;*

*an insulating film which is provided on an upper surface of the semiconductor structure and on an upper surface of the insulating member, and which exposes at least a portion of each of the external electrodes; and*

*a plurality of upper wirings, each of which has a connection pad portion which is located above the insulating film, and each of which is electrically connected to a corresponding one of the external electrodes of the semiconductor structure.*

*12. A device according to claim 11, wherein the insulating film includes a resin and reinforcing materials contained in the resin.*

*13. A device according to claim 12, wherein the insulating member has a frame shape having at least one opening portion, and the semiconductor structure is arranged in the opening portion.*

*14. A device according to claim 13, wherein the upper surface of the insulating member is substantially flush with the upper surface of the semiconductor structure, and a lower surface of the insulating member is substantially flush with a lower surface of the semiconductor structure.*

*15. A device according to claim 11, further comprising a base plate having a rectangular planar shape so as to carry the semiconductor structure and the insulating member.*

*16. A device according to claim 15, further comprising an adhesive layer for coupling the semiconductor structure and the base plate, wherein the adhesive layer is intervened between the semiconductor structure and the base plate.*

*17. A semiconductor device comprising:*

*a semiconductor structure including: (i) a semiconductor substrate, (ii) a plurality of connection pads provided on the semiconductor substrate, (iii) an insulating layer which covers a surface of the semiconductor substrate and which has openings to expose at least portions of the connection pads on the semiconductor substrate, (iv) a plurality of wirings, each of which includes a connection pad portion that is located above the insulating layer and that is electrically connected to a corresponding one of the connection pads on the semiconductor substrate through one of the openings of the insulating layer, (v) a plurality of external electrodes, each of which is provided on a corresponding one of the connection pad portions, and (vi) a sealing film which is provided above the insulating layer and around each of the external electrode and the wirings, the sealing film having a periphery that is the same size as a periphery of the semiconductor substrate and that has a planar shape that is coincident with a planar shape of the periphery of the semiconductor substrate;*

*an insulating member which is made of a resin containing reinforcing materials and arranged on a side of the semiconductor structure;*

*an insulating film which is provided on an upper surface of the semiconductor structure and on an upper surface of the insulating member, and which exposes at least a portion of each of the external electrodes; and*

*a plurality of upper wirings, each of which has a connection pad portion which is located above the insulating film, and each of which is electrically connected to a corresponding one of the external electrodes of the semiconductor structure.*

*18. A device according to claim 17, wherein the upper surface of the insulating member is substantially flush with the upper surface of the semiconductor structure.*

*19. A device according to claim 17, wherein the insulating film includes a resin and reinforcing materials contained in the resin.*

*20. A device according to claim 19, wherein the insulating member has a frame shape having at least one opening portion, and the semiconductor structure is arranged in the opening portion.*

*21. A device according to claim 20, wherein the upper surface of the insulating member is substantially flush with the upper surface of the semiconductor structure, and a lower surface of the insulating member is substantially flush with a lower surface of the semiconductor structure.*

*22. A device according to claim 17, further comprising a base plate having a rectangular planar shape so as to carry the semiconductor structure and the insulating member.*

*23. A device according to claim 22, further comprising an adhesive layer for coupling the semiconductor structure and the base plate, wherein the adhesive layer is intervened between the semiconductor structure and the base plate.*

*24. A device according to claim 22, further comprising an adhesive layer for coupling the insulating member and the base plate, wherein the adhesive layer is intervened between the insulating member and the base plate.*

*25. A semiconductor device comprising:*

*a base plate having a rectangular planar shape;*

*a semiconductor structure which is provided above the base plate and which includes: (i) a semiconductor substrate, (ii) a plurality of external electrodes, which are mounted above the semiconductor substrate, and each of which has an upper surface, and (iii) a sealing film having a periphery that is the same size as a periphery of the semiconductor substrate and that has a planar shape that is coincident with a planar shape of the periphery of the semiconductor substrate;*

*an insulating member which is arranged above the base plate beside the semiconductor structure, and which has a rectangular frame shape which includes an opening portion in which the semiconductor structure is positioned, an upper surface of the insulating member being substantially flush with an upper surface of the semiconductor structure, and a lower surface of the insulating member being substantially flush with a lower surface of the semiconductor structure;*

*an insulating film which is provided on the upper surface of the semiconductor structure and on the insulating member, and which exposes at least a portion of the upper surface of each of the external electrodes; and*

*a plurality of upper wirings, each of which has a connection pad portion which is located above the insulating film, and each of which is electrically connected to a corresponding one of the external electrodes of the semiconductor structure.*

*26. A device according to claim 25, wherein the insulating member is made of a thermosetting resin containing a reinforcing material.*

*27. A device according to claim 26, wherein an upper surface of the sealing film is flush with the upper surface of each of the external electrodes.*

* * * * *